United States Patent
Albericio Latorre et al.

(10) Patent No.: US 11,379,420 B2
(45) Date of Patent: Jul. 5, 2022

(54) DECOMPRESSION TECHNIQUES FOR PROCESSING COMPRESSED DATA SUITABLE FOR ARTIFICIAL NEURAL NETWORKS

(71) Applicant: NVIDIA Corporation, Santa Clara, CA (US)

(72) Inventors: Jorge Albericio Latorre, San Jose, CA (US); Jack H. Choquette, Palo Alto, CA (US); Manan Maheshkumar Patel, San Jose, CA (US); Jeffrey Pool, Durham, NC (US); Ming Y. Siu, Santa Clara, CA (US); Ronny Meir Krashinsky, San Francisco, CA (US); Ganesh Venkatesh, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 182 days.

(21) Appl. No.: 16/359,787

(22) Filed: Mar. 20, 2019

(65) Prior Publication Data

US 2020/0285618 A1 Sep. 10, 2020

Related U.S. Application Data

(60) Provisional application No. 62/815,887, filed on Mar. 8, 2019.

(51) Int. Cl.
*G06F 16/174* (2019.01)
*G06F 16/901* (2019.01)
(Continued)

(52) U.S. Cl.
CPC ........ *G06F 16/1744* (2019.01); *G06F 16/156* (2019.01); *G06F 16/901* (2019.01); *G06N 3/08* (2013.01); *H03M 7/30* (2013.01)

(58) Field of Classification Search
CPC .. G06F 16/1744; G06F 16/901; G06F 16/156; G06N 3/08; H03M 7/30; H03M 7/6023; H03M 7/3059; H03M 7/6005
See application file for complete search history.

(56) References Cited

U.S. PATENT DOCUMENTS 7,685,161 B2 3/2010 Kryeziu
8,713,080 B2 4/2014 Moloney
(Continued)

FOREIGN PATENT DOCUMENTS

CN 107480150 A 12/2017

OTHER PUBLICATIONS

Kang et al., "Accelerator-Aware Pruning for Convolutional Neural Networks," IEEE Transactions on Circuits and Systems for Video Technology, Apr. 26, 2018, 11 pages. Retrieved from https://arxiv.org/pdf/1804.09862.pdf.

*Primary Examiner* — William B Partridge
*Assistant Examiner* — Aryan D Toughiry
(74) *Attorney, Agent, or Firm* — Zilka-Kotab, P.C.

(57) ABSTRACT

Compressed data is oftentimes beneficial for reducing the computing resources required, for example, to transmit and store data. The compression of data is particularly useful when dealing with sparse data (data that includes numerous zeros or near-zero values) and only non-zero values above a certain threshold have significance. When dealing with compressed data, oftentimes the data needs to be decompressed for processing (e.g., by deep learning networks or other applications configured to operate on sparse, or other uncompressed data). Instructions are disclosed for supporting the decompression of compressed data by a processing unit such as a CPU and GPU.

22 Claims, 18 Drawing Sheets

Exemplary N:M Compression Format

(51) Int. Cl.
*G06N 3/08* (2006.01)
*H03M 7/30* (2006.01)
*G06F 16/14* (2019.01)

(56) References Cited

U.S. PATENT DOCUMENTS

| | | |
|---|---|---|
| 2016/0124659 A1* | 5/2016 | Oportus Valenzuela ............... G06F 12/08 711/165 |
| 2017/0177404 A1 | 6/2017 | Drysdale et al. |
| 2018/0095674 A1* | 4/2018 | Alameldeen ............ G06F 3/064 |
| 2019/0130272 A1* | 5/2019 | Yosinski ................ G06F 17/16 |
| 2020/0143249 A1* | 5/2020 | Georgiadis ............ G06N 3/082 |

* cited by examiner

DECOMPRESSION TECHNIQUES FOR PROCESSING COMPRESSED DATA SUITABLE FOR ARTIFICIAL NEURAL NETWORKS

CLAIM OF PRIORITY

This application claims the benefit of U.S. Provisional Application No. 62/815,887 titled "DECOMPRESSION TECHNIQUES FOR PROCESSING COMPRESSED DATA SUITABLE FOR ARTIFICIAL NEURAL NETWORKS," filed Mar. 8, 2019, the entire contents of which is incorporated herein by reference.

FIELD OF THE INVENTION

The present invention relates to compressed data, and more particularly to the decompression of compressed data.

BACKGROUND

There are many circumstances in computing where compressed data is beneficial. In general, since the compression of data will reduce the size of the data, the compressed data can be transmitted, stored, and sometimes even processed with less required computing resources (e.g., bandwidth, storage, etc.) than would otherwise be required if the data were not compressed. The compression of data finds particular usefulness when dealing with sparse data, as described below. Of course, it should be noted that data compression may similarly be useful with other types of data that may not necessarily be sparse, for the reasons mentioned above.

In deep learning networks, and other applications, there is typically a large amount of data involved that is considered sparse data, or in other words, data that includes numerous zeros or near-zero values. Due to the large size of the data involved in such applications, it is helpful to compress the data (e.g., reduce the data size) in order to save bandwidth resources when transmitting the data and save memory resources when storing the data. Typically, the data will be compressed in a format that will try to preserve the significant values (e.g., non-zero values or values above a predetermined threshold) in the original data while excluding the insignificant values.

However, in many cases, the compressed data must be decompressed for processing purposes. For example, deep learning networks (or other applications mentioned above) will generally require the data to be in a decompressed state prior to processing. This is especially true when the data is processed by hardware units that require the data in the decompressed state. The decompressed data will be the same as, or substantially the same as, the original data on which the compression was initially performed. Unfortunately, traditional data decompression techniques handling compressed sparse data, or other types of compressed data, are oftentimes complex and require complicated arithmetic units in hardware, which is costly. There is a need for addressing these issues and/or other issues associated with the prior art.

SUMMARY

In an embodiment, a method, computer readable medium, and system are disclosed for an instruction that decompresses a least a portion of compressed data. An N element data structure is received as input, where each element in the N element data structure holds a value. The N element data structure was previously generated by compressing an original M element data structure, where N<M. Additionally, metadata associated with the N element data structure is received as input. The metadata specifies for each value in the N element data structure a location where the value originated in the M element data structure. Further, a destination M element data structure is optionally initialized. At least one instruction is executed to decompress at least a portion of the N element data structure into at least a portion of the destination M element data structure by writing to the destination M element data structure one or more values of the N element data structure at the location(s) specified by the associated metadata. Given that an N element data structure decompresses fully into a destination M element data structure, the compression ratio between the compressed and uncompressed data is N to M (or N:M).

In an embodiment, a method, computer readable medium, and system are disclosed for an instruction that takes as input compressed data and generates less densely compressed data by partially decompressing the input compressed data. An N element data structure (as discussed above) and its associated metadata (also as discussed above) are received as input. The input N element data structure can be decompressed into an M element data structure, representing a N:M compression ratio. At least one instruction is executed to generate from the N element data structure and its associated metadata, a R element data structure and corresponding metadata, where N<=R<M (where "<=" means "less than or equal to"). The R element data structure and its associated metadata decompress fully into a Q element data structure, where Q<=M and the Q element data structure corresponds to at least a portion of the M element data structure. Hence, the compression ratio between the R element data structure (holding compressed data) and the Q element data structure (holding uncompressed data) is R:Q. When both R!=N and Q!=M (where "!=" means "not equal"), the compression ratio R:Q>N:M. Thus the resulting R element data structure and metadata represent a less densely compressed data than the N element data structure and metadata.

DETAILED DESCRIPTION

Figure 1:
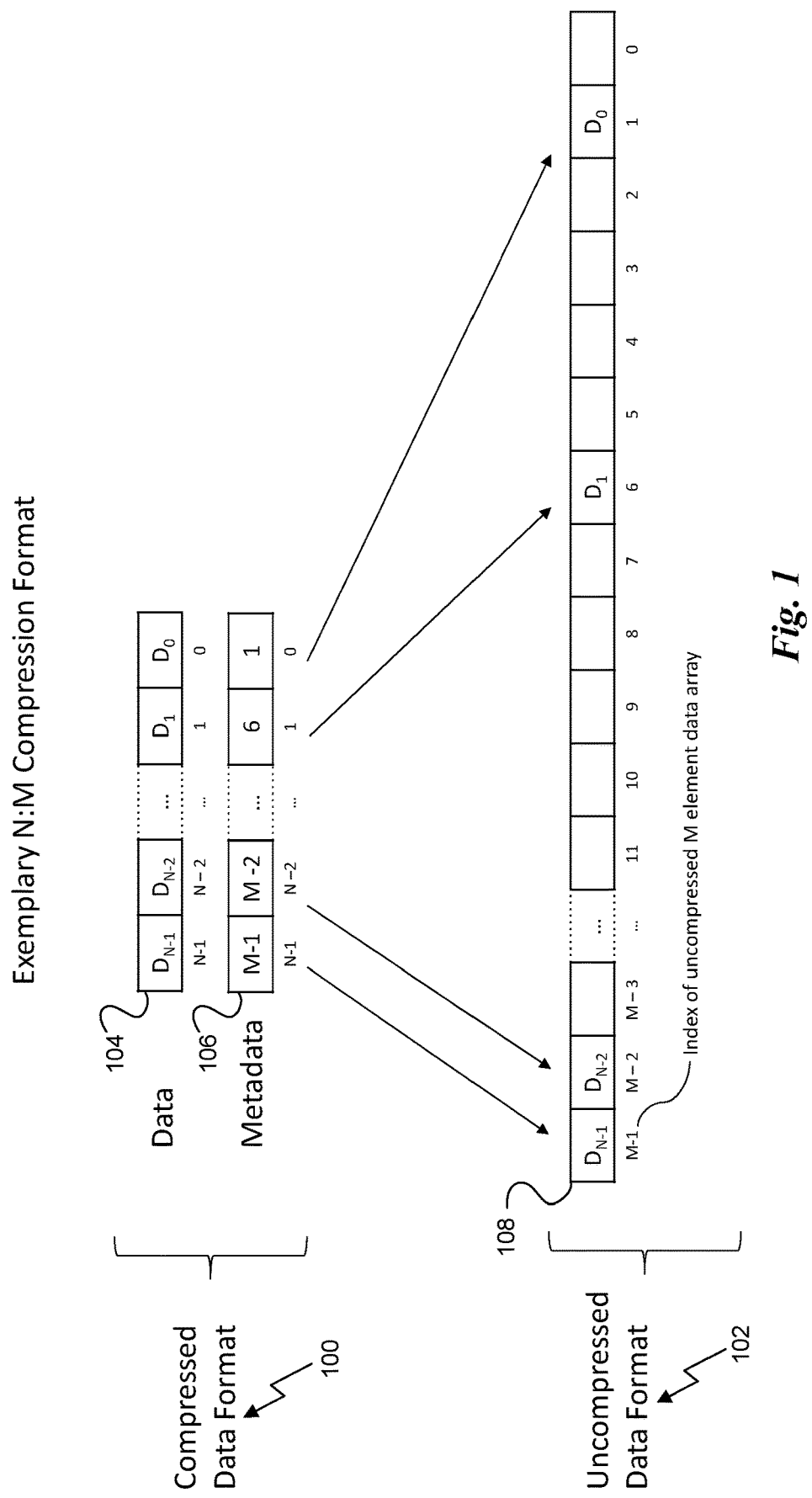
FIG. 1 illustrates exemplary N:M compression format.

FIG. 1 illustrates an exemplary N:M compression format. Compression data format 100 includes an N element data structure 104 and metadata 106. Data held in compression data format 100 is decompressed into an uncompressed data format 102. Uncompressed data format 102 includes an M element data structure 108, where N<M. Metadata 106 indicates for each datum $D_{N-1}, \ldots, D_1, D_0$ in the N element data structure 102 the location (e.g., M−1, M−2, 6, 1) in the M element data structure 108 where the datum is to be copied. Given that the data in the N element data structure 104 is decompressed into the M element data structure 108, the compression format shown in FIG. 1 is referred to has having a compression to decompression ratio of N to M (or "N:M").

In an embodiment, each datum $D_{N-1}, \ldots, D_1, D_0$ may be a numeric value. A numeric value may be represented in any number of bits (e.g., 4-bit ("nibble"), 8-bit ("byte"), 16-bit ("half"), 32-bit ("word"), 64-bit ("double"), etc.) encoded in an integer, floating point, fixed, logarithmic, or any other numeric format for encoding numeric values on a computer.

In an embodiment, metadata 106 may include N entries, where each entry corresponds to one datum in the N element data structure 104, and each entry indicates the location (e.g., an index) where the corresponding datum is to be copied into the M element data structure 108. In another embodiment (not shown), metadata 106 may include an M number of bits, where only N number of bits are set indicating the locations where each datum in the N element data structure 102 is to be copied into the M element data structure 108. In yet another embodiment (not shown), metadata 106 may include an index into a lookup table ("LUT") that provides information on where each datum in the N element data structure 102 is to be copied into the M element data structure 108.

Figure 2:
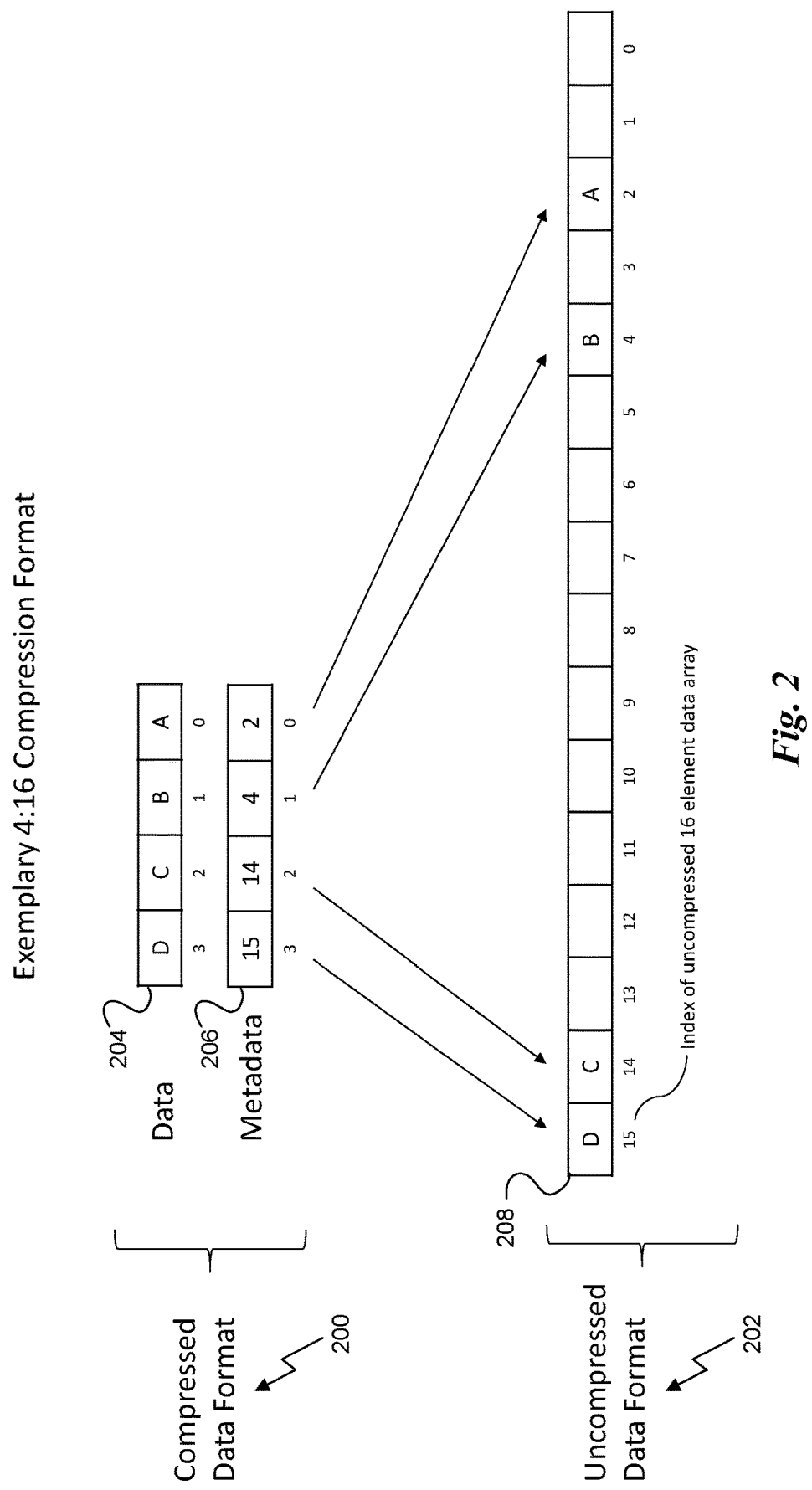
FIG. 2 illustrates exemplary 4:16 compression format.

FIG. 2 illustrates an exemplary 4:16 compression format. As shown in FIG. 2, compressed data format 200 is decompressed into uncompressed data format 202. Compressed data format 200 includes an N element data structure 204, where N=4. As shown, the 4 element data structure 204 includes 4 exemplary values A, B, C, and D. Compressed data format 200 further includes metadata 206 with 4 exemplary entries indicating where each of the exemplary values A, B, C, and D are to be copied into the M element data structure 208 (where M=16) when the 4 element data structure 202 is decompressed into the 16 element data structure 208. Given that the data in the 4 element data structure 204 is decompressed into the 16 element data structure 208, the compression format shown in FIG. 2 is referred to as having a compression to decompression ratio of 4 to 16 (or "4:16").

Figure 3:
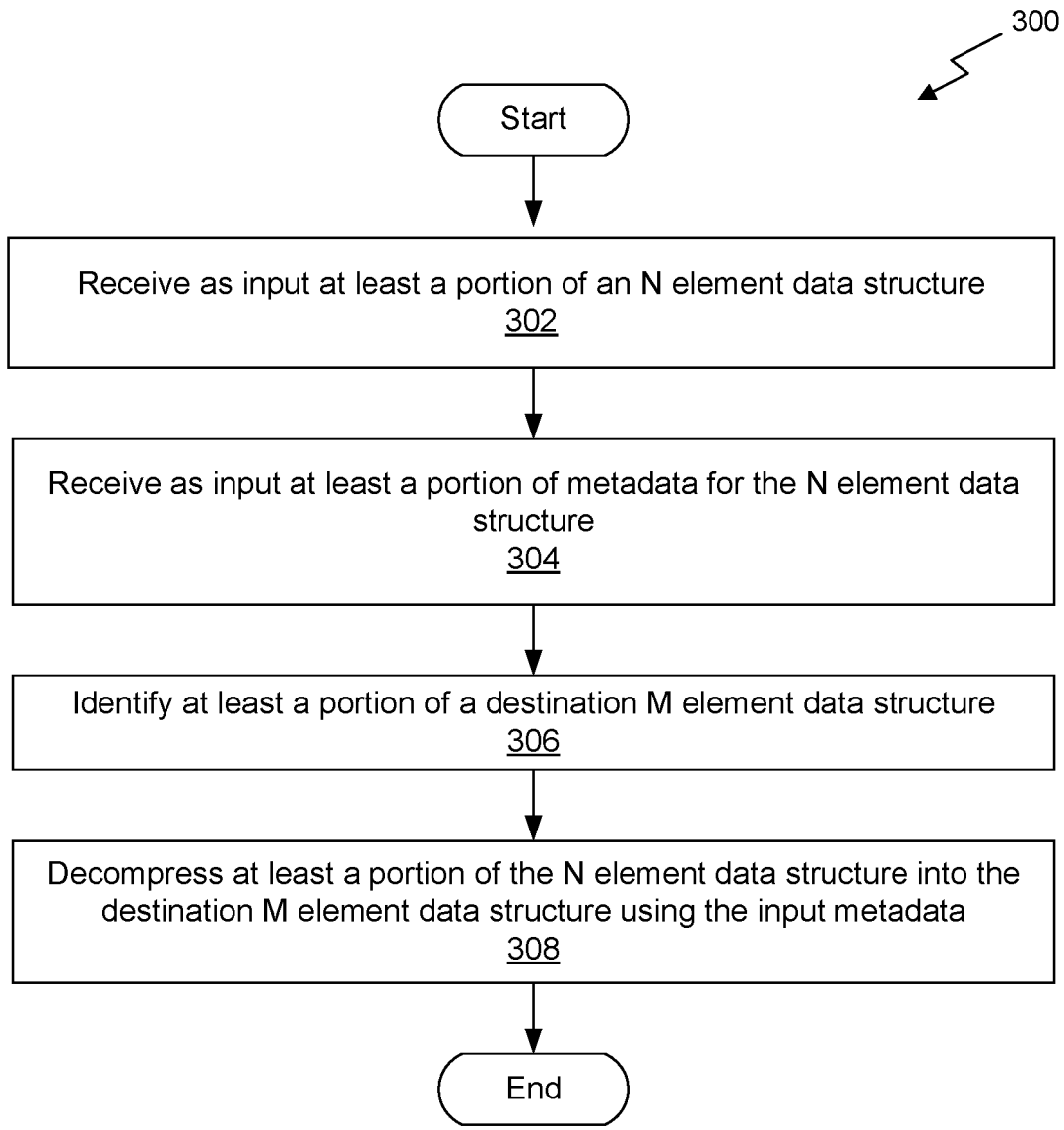
FIG. 3 illustrates an exemplary flowchart for decompressing compressed data in N:M compression format.

FIG. 3 illustrates an exemplary flowchart of a method 300 for decompressing compressed data in N:M compression format. An instruction may be executed to cause the method 300 to be performed on all or a portion of a compressed data. Such an instruction may be performed by a GPU (graphics processing unit), CPU (central processing unit), or other computing hardware.

In step 302, at least a portion of an N element data structure is received as input. The N element data structure may have been generated by compressing an original M element data structure, where N<M. Each element in the N element data structure includes a datum (e.g., a numeric value). The N element data structure, and similarly the M element data structure may be an array, vector, matrix, tensor, or any other type of structure for holding data. In an embodiment, the original M element data structure may be comprised of sparse data, in which case the N element data structure may have been generated by compressing the M element data structure to exclude zeros or near-zero values (e.g., values that are within some small threshold value(s) near zero such as values within −0.03 and 0.05 or in another example, values within −0.05 and 0.05).

In step 304, at least a portion of metadata for the N element data structure is received as input. The metadata specifies for each datum in the N element data structure where the datum is to be copied into an M element data structure.

In step 306, at least a portion of a destination M element data structure is identified and may be initialized. In an embodiment, initializing may include setting all or some of the elements in the destination M element data structure to a predetermined default value such as, for example, zero, null, 0.05, etc. In an embodiment, initializing may include setting all or some of the elements in the destination M element data structure to a random or pseudo-random value or near-zero value. In an embodiment, initializing may include setting all or some of the elements in the destination M element data structure with values obtained from another M element data structure, or other data source.

In step 308, at least a portion of the input N element data structure is decompressed into the destination M element data structure using the input metadata. The decompression is performed by writing to the destination M element data structure each datum in the received N element data structure at the location specified by the metadata. Remaining elements of the destination M element data structure may maintain their existing or initialized values (e.g., zero, null, random value, etc.).

Method 300 can be performed by a single thread of execution. Alternatively, the method 300 can be performed by a plurality of threads. In an embodiment, a single thread decompresses all of the input N element data structure. In another embodiment, each of a pair of threads decompresses half of the input N element data structure. In yet another embodiment, each of a quad of threads decompresses a quarter of the input N element data structure. Further, in an embodiment, different threads, or different instructions in a single thread, may use the same input N element data structure or different instances of the N element data structure. Additionally, in an embodiment, different threads, or different instructions in a single thread may operate on different instances of the destination M element data structure. In another embodiment, the different threads, or different instructions in a single thread, may operate on a shared instance of the destination M element data structure. While the present description, both above and below, describes threads of execution (e.g., on a GPU), it should be noted that lanes of execution (e.g., on each execution path of a single instruction multiple data (SIMD) CPU) may similarly be utilized in place or in addition to threads.

A format for an exemplary instruction named SCATTER for causing a GPU, CPU, or other computing hardware to perform method 300 is shown in Table 1.

TABLE 1

SCATTER{.elsize}.mode{.idxSize}{.partial} Rd, Ra, Rb, {Rc,} #VecIdx {#Mask} where:
Ra: source register for holding all or a portion of an N element data structure
Rb: source register for holding all or a portion of the metadata for the N element data structure
Rd: destination register for holding all or portion of the destination M element data structure
{Rc}: optional source register containing all or a portion of another N element data structure, which may be utilized to initialize Rd (alternatively, Rd can be initialized with zeros or any other predefined value(s))
{elsize}: optional parameter indicating the number of bits used to represent a datum in the N element data structure (e.g., elsize="8b" for 8 bits, "16b" for 16 bits, etc.); if not provided, SCATTER defaults to 8 bits
{idxSize}: optional parameter indicating the number of bits used to represent an entry in the metadata (e.g., idxSize="U8" for 8 bits, "U4" for 4 bits, etc.); if not provided, SCATTER defaults to 8 bits
VecIdx: indicates which portion of the destination M element data structure is held in Rd
{#Mask}: an optional bit mask indicating which portions of Ra will be decompressed
mode: one of "THREAD," "PAIR", or "QUAD" indicating how #VecIdx is to be interpreted as described in greater detail below
{.partial}: optional parameter indicating whether Ra will be partially decompressed, for example, to create a less densely compressed data The SCATTER instruction treats the source register Ra as storing X elements of the N element data structure where $$X = \left\lfloor \frac{B}{elsize} \right\rfloor$$

where B is the number of bits that can be stored in register Ra (e.g., 32 bits). Thus when register Ra holds 32 bits and elsize is 8 bits, SCATTER treats the source register Ra as storing 4 elements of the N element data structure $$\left(\text{i.e., } X = \left\lfloor \frac{32}{8} \right\rfloor = 4\right).$$

In another example, when register Ra holds 32 bits and elsize is 16 bits, SCATTER treats the source register Ra as storing 2 elements of the N element data structure $$\left(\text{i.e., } X = \left\lfloor \frac{32}{16} \right\rfloor = 2\right).$$

The SCATTER instruction also treats the destination register Rd as storing X elements of the M element data structure, where X is computed as described above. Given that M can be much larger than X, SCATTER treats Rd as holding only a contiguous X element portion of the M element data structure. The specific portion of the M element data structure is specified by the #VecIdx input to the SCATTER instruction and the mode of the SCATTER instruction.

In the THREAD mode, the SCATTER instruction interprets #VecIdx as indicating that Rd holds locations (#VecIdx*X+X−1) to (#VecIdx*X) of the M element data structure. For example, if X=4, a #VecIdx value of 0 indicates that Rd holds locations 3 . . . 0 of the M element data structure, a #VecIdx value of 1 indicates that Rd holds locations 7 . . . 4, a #VecIdx value of 2 indicates that Rd holds locations 11 . . . 8, etc. In another example, if X=2, a #VecIdx value of 0 indicates that Rd holds locations 1 and 0, a #VecIdx value of 1 indicates that Rd holds locations 3 and 2, etc.

In PAIR mode, the SCATTER instruction interprets #VecIdx as indicating that Rd holds locations (#VecIdx*2X+X−1+(ThreadID modulus 2)*X) to (#VecIdx*2X+(ThreadID modulus 2)*X) of the M element data structure. The ThreadID (short for "thread identifier") is a numeric value associated with the thread executing the SCATTER instruction. For example, if X=4 and the ThreadID of the thread executing the SCATTER instruction is 28, a #VecIdx value of 1 indicates that Rd holds locations 11 . . . 8. Also, if X=4 and the ThreadID of the thread executing the SCATTER instruction is 29, a #VecIdx value of 1 indicates that Rd holds locations 15 . . . 12. Likewise, if X=4 and the ThreadID of the thread executing the SCATTER instruction is 29, a #VecIdx value of 2 indicates that Rd holds locations 23 . . . 20.

In QUAD mode, the SCATTER instruction interprets #VecIdx as indicating that Rd holds locations (#VecIdx*4X+X−1+(ThreadID modulus 4)*X) to (#VecIdx*4X+(ThreadID modulus 4)*X) of the M element data structure. For example, if X=4 and the ThreadID of the thread executing the SCATTER instruction is 17, a #VecIdx value of 1 indicates that Rd holds locations 23 . . . 20.

One example of an instruction conforming to the format shown in Table 1 is shown in Table 2.

TABLE 2

SCATTER.THREAD R12, R10, R11 0

The exemplary instruction in Table 2 indicates that at least a portion of the N element data structure is stored in register R10, at least a portion of the metadata is stored in R11, and the contents of R10 should be decompressed into R12. Further, as explained above, where registers R10 and R12 each store 32-bits, a 0 value for #VecIdx indicates that R12 represents the portion of the destination M element data structure having locations 3 . . . 0.

Another example of an instruction conforming to the format shown in Table 1 is shown in Table 3.

TABLE 3

SCATTER.16b.THREAD.U4 R12, R10, R11 0

The exemplary instruction in Table 3 conveys the same instruction shown in Table 2 except the exemplary instruction in Table 3 indicates that the datum in the N element data structure are represented in 16 bits instead of 8 bits, and that the entries in the metadata are represented in 4 bits instead of 8 bits. Further, as explained above, where registers R10 and R12 each store 32-bits, a 0 value for #VecIdx in this instance indicates that R12 represents the portion of the destination M element data structure having locations 1 and 0.

Figure 4:
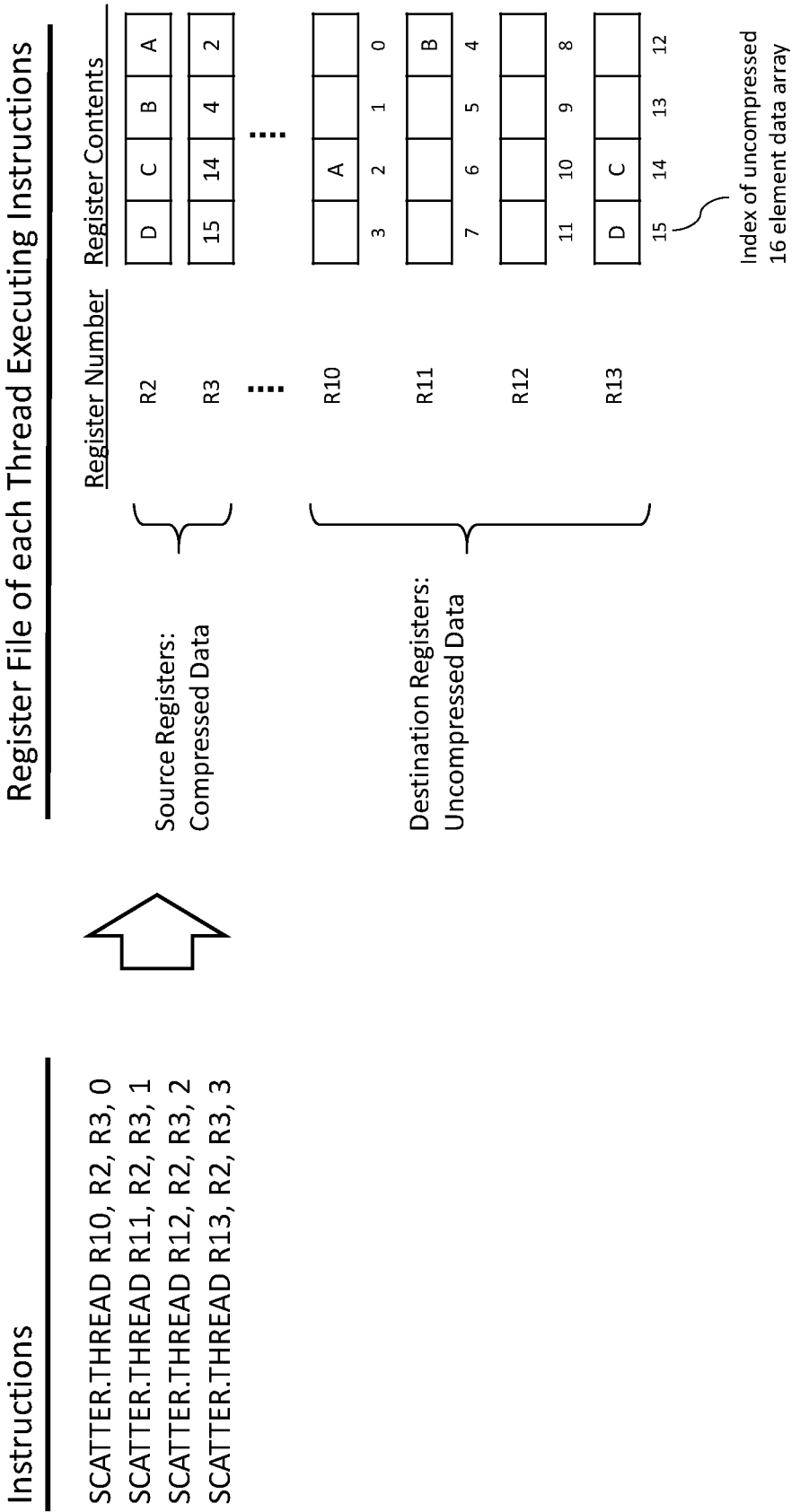
FIG. 4 illustrates an exemplary 4:16 decompression instruction.

FIG. 4 illustrates an exemplary set of instructions that perform 4:16 decompression. In the present example, the 4:16 decompression operates in the THREAD mode described above. More specifically, each thread of execution performing the exemplary set of instructions shown in FIG. 4 performs a complete 4:16 decompression of a 4 element data structure (in R2) and metadata (in R3) to a 16 element data structure (in R10, R11, R12, R13). In a multi-threaded processor, each thread may operate on its own set of registers (e.g., each thread having its own 32 registers named R0, R1, R2, . . . R31). Hence, while the same instructions shown in FIG. 4 can be processed by multiple threads, each thread may execute with different values stored in its own set of source registers R2 and R3 (representing different compressed 4 element data structure) to produce corresponding decompressed data in its own set of destination registers R10, R11, R12, and R13.

As shown, the first instruction (SCATTER.THREAD R10, R2, R3, 0) indicates that the N element data structure is stored in register R2, the metadata is stored in R3, and at least a portion of the contents of R2 should be decompressed into R10. Further, the 0 value (for #VecIdx) indicates that R10 represents the portion of the destination M element data structure having locations 3 . . . 0. When the first instruction is executed, value A from register R2 is copied to R10 at the position corresponding to location 2 in the destination M element data structure (as specified by the metadata in R3). Because the metadata in R3 indicates that there are no other values in R2 for locations 3 . . . 0 in the destination M element data structure, no other values (i.e., B, C, or D) are copied into register R10.

The second instruction (SCATTER.THREAD R11, R2, R3, 1) indicates that the N element data structure is stored in register R2, the metadata is stored in R3, and at least a portion of the contents of R2 should be decompressed into R11. Further, the 1 value (for #VecIdx) indicates that R11 represents the portion of the destination M element data structure having locations 7 . . . 4. When the second instruction is executed, value B from register R2 is copied to R11 at the position corresponding to location 4 in the destination M element data structure (as specified by the metadata in R3).

The third instruction (SCATTER.THREAD R12, R2, R3, 2) indicates that the N element data structure is stored in register R2, the metadata is stored in R3, and at least a portion of the contents of R2 should be decompressed into R12. Further, the 2 value (for #VecIdx) indicates that R12 represents the portion of the destination M element data structure having locations 11 . . . 8. When the third instruction is executed, no values from register R2 are copied to R12 because the metadata in R3 indicates that no value in R2 corresponds to one of the locations 11 . . . 8 in the destination M element data structure.

The fourth instruction (SCATTER.THREAD R13, R2, R3, 3) indicates that the N element data structure is stored in register R2, the metadata is stored in R3, and at least a portion of the contents of R2 should be decompressed into R13. Further, the 3 value (for #VecIdx) indicates that R12 represents the portion of the destination M element data structure having locations 15 . . . 12. When the fourth instruction is executed, values C and D from register R2 are copied to R13 at the positions corresponding to locations 14 and 15, respectively, in the destination M element data structure (as specified by the metadata in R3).

Figure 5:
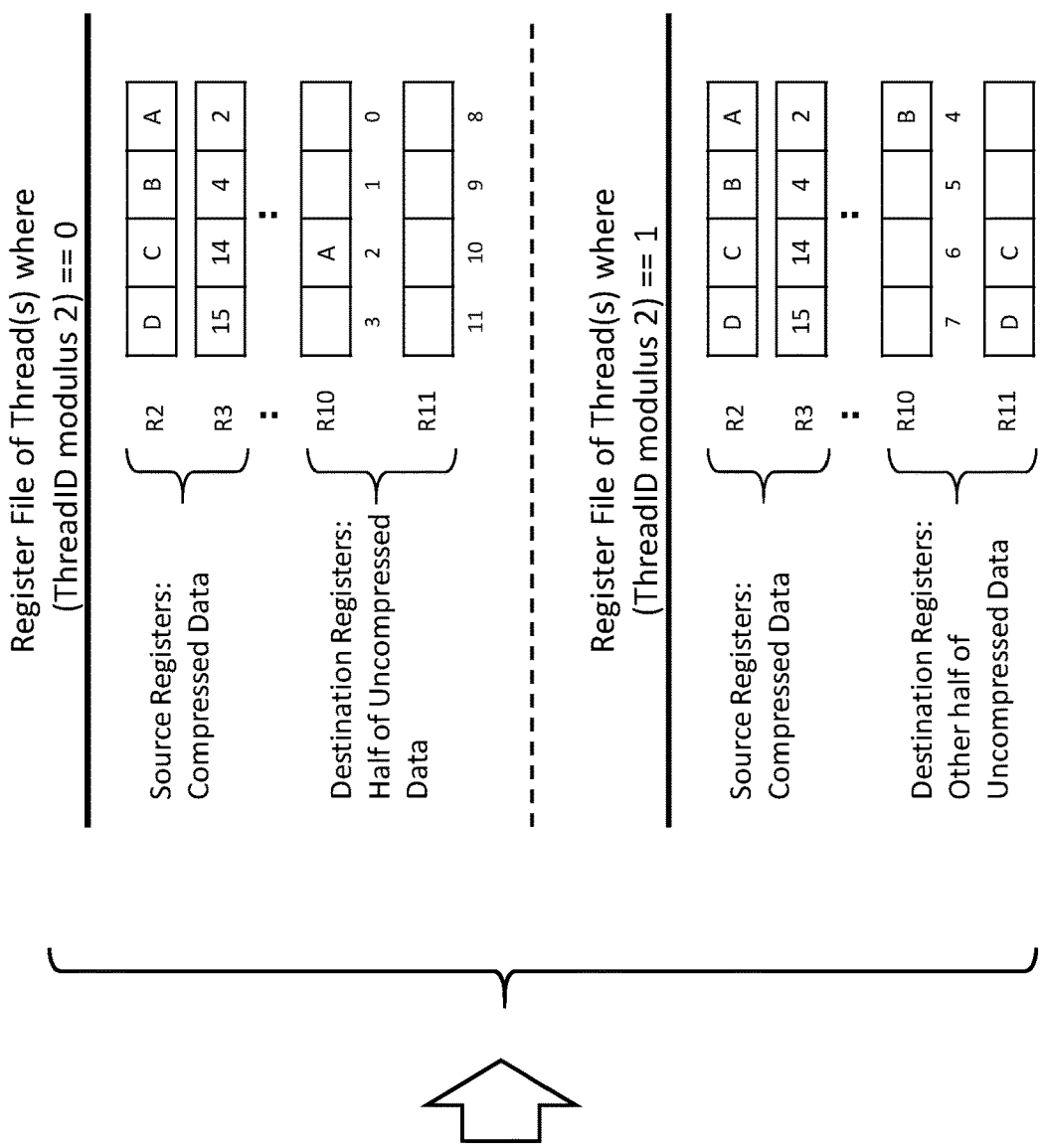
FIG. 5 illustrates an exemplary 4:16 decompression instruction operating in PAIR mode.

FIG. 5 illustrates an exemplary 4:16 decompression instruction operating in PAIR mode. In PAIR mode, each of a pair of threads can decompress half of the N element data structure. As discussed above, in some embodiments, each thread operates on its own set of registers. In the example shown in FIG. 5, 2 instructions complete the 4:16 decompression when at least two threads execute the 2 instructions, where each thread decompresses half of the original N element data structure.

As shown, the first instruction (SCATTER.PAIR R10, R2, R3, 0) indicates that the N element data structure is stored in register R2, the metadata is stored in R3, at least a portion of the contents of R2 should be decompressed into R10. Further, the 0 value (for #VecIdx) indicates that R10 represents the portion of the destination M element data structure having locations 3 . . . 0 when the thread executing the first instruction has an even ThreadID value (i.e., (ThreadID modulus 2)==0) and locations 7 . . . 4 when the thread executing the first instruction has an odd ThreadID (i.e., (ThreadID modulus 2)==1). When the first instruction is executed by a thread having an even ThreadID value, value A from register R2 is copied to R10 at a position corresponding to location 2 in the destination M element data structure (as specified by the metadata in R3). When the first instruction is executed by a thread having an odd ThreadID value, value B from register R2 is copied to R10 at a position corresponding to location 4 in the destination M element data structure (as specified by the metadata in R3).

In addition, the second instruction (SCATTER.PAIR R11, R2, R3, 1) indicates that the N element data structure is stored in register R2, the metadata is stored in R3, and at least a portion of the contents of R2 should be decompressed into R11. Further, the 1 value (for #VecIdx) indicates that R11 represents the portion of the destination M element data structure having locations 11 . . . 8 when the thread executing the second instruction has an even ThreadID value and locations 15 . . . 12 when the thread executing the second instruction has an odd ThreadID value. When the second instruction is executed by a thread having an even ThreadID value, no values from register R2 is copied to R11 as specified by the metadata in R3. When the second instruction is executed by a thread having an odd ThreadID value, values C and D are copied to R11 at positions corresponding to locations 14 and 15, respectively, in the destination M element data structure (as specified by the metadata in R3).

Figure 6:
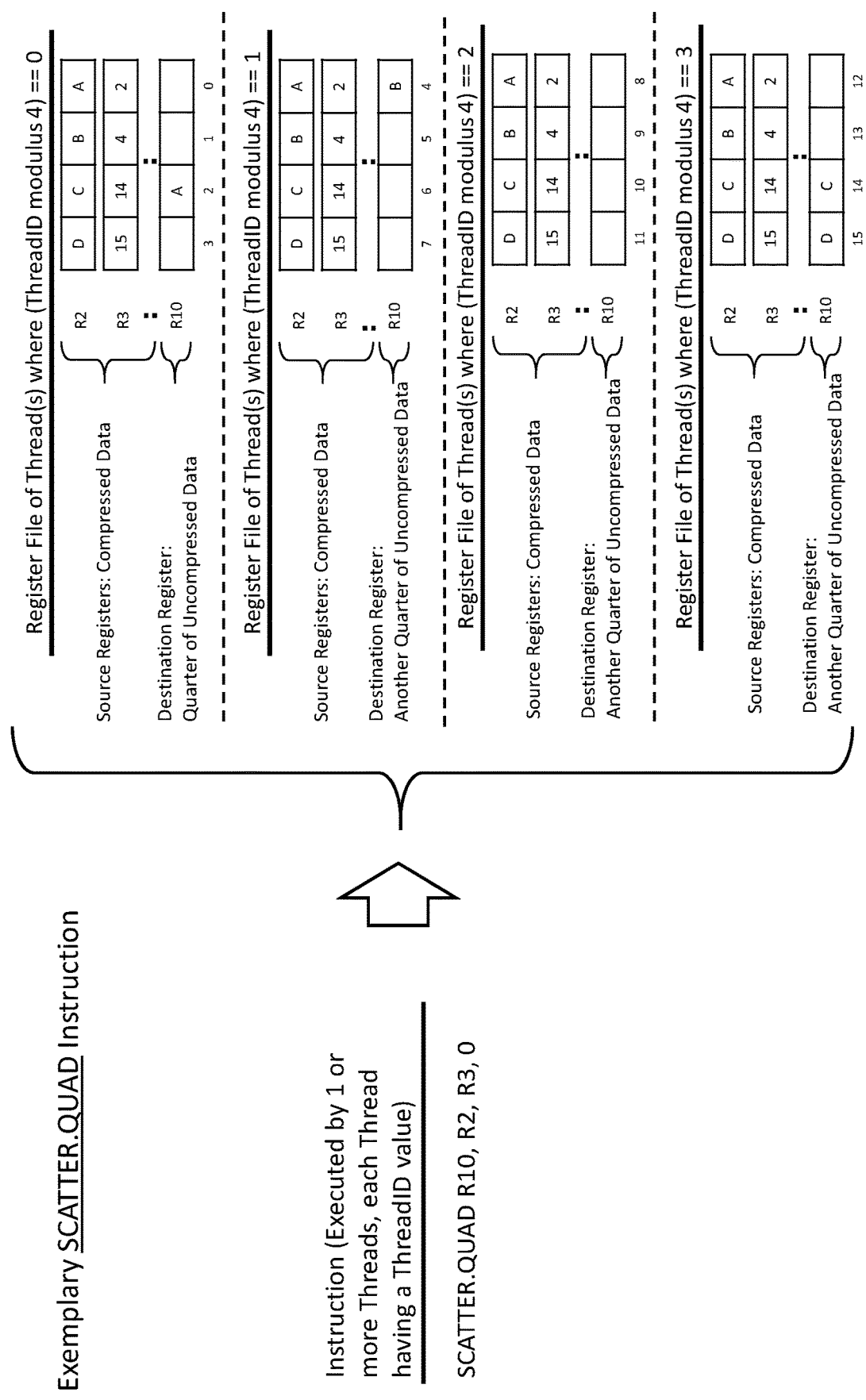
FIG. 6 illustrates an exemplary 4:16 decompression instruction operating in QUAD mode.

FIG. 6 illustrates an exemplary 4:16 decompression instruction operating in QUAD mode. In QUAD mode, each of a quad of threads can decompress a quarter of the N element data structure. As discussed above, in some embodiments, each thread operates on its own set of registers. In the example shown in FIG. 6, 1 instruction completes the 4:16 decompression when at least four threads execute the single instruction, where each thread decompresses a quarter of the original N element data structure.

As shown, the first instruction (SCATTER.QUAD R10, R2, R3, 0) indicates that the N element data structure is stored in register R2, the metadata is stored in R3, and at least a portion of the contents of R2 should be decompressed into R10. Further, the 0 value (for #VecIdx) indicates that R10 represents the portion of the destination M element data structure having locations 3 . . . 0 when the thread executing the first instruction has a first quadrant ThreadID value (i.e., (ThreadID modulus 4)==0), locations 7 . . . 4 when the thread has a second quadrant ThreadID value (i.e., (ThreadID modulus 4)==1), locations 11 . . . 8 when the thread has a third quadrant ThreadID value (i.e., (ThreadID modulus 4)==2), and locations 15 . . . 12 when the thread has a fourth quadrant ThreadID value (i.e., (ThreadID modulus 4)==3). When the first instruction is executed by a thread having a first quadrant ThreadID, value A from register R2 is copied to R10 at a position corresponding to location 2 of the destination M element data structure (as specified by the metadata in R3). Additionally, when the first instruction is executed by a thread having a second quadrant ThreadID, value B from register R2 is copied to R10 at a position corresponding to location 4 of the destination M element data structure (as specified by the metadata in R3). When the first instruction is executed by a thread having a third quadrant ThreadID, no value from register R2 is copied to R10 as specified by the metadata in R3. Finally, when the first instruction is executed by a thread having a fourth quadrant ThreadID, values C and D are copied to R10 at positions corresponding to locations 14 and 15, respectively, of the destination M element data structure (as specified by the metadata).

Figure 7:
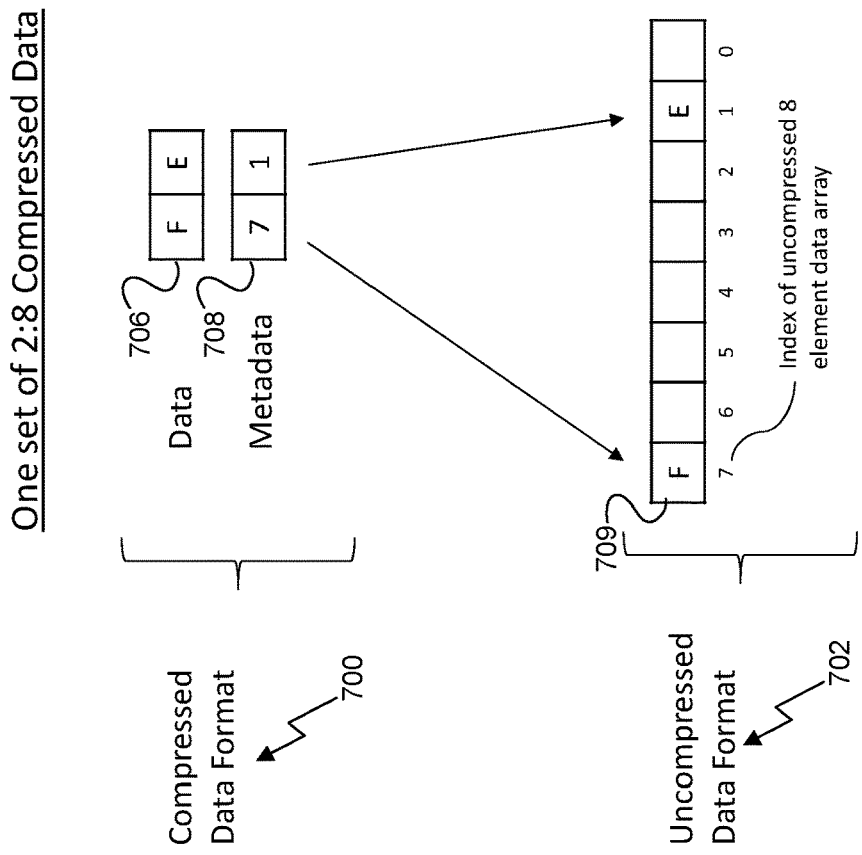
FIG. 7 illustrates an exemplary generation of less densely compressed data from more densely compressed data.

FIG. 7 illustrates an exemplary generation of less densely compressed data from more densely compressed data. As shown in FIG. 7, instead of decompressing compressed data format 700 into uncompressed data format 702, as described for example in FIG. 2, FIG. 7 shows the compressed data format 700, having a more densely compressed data (2:8 as shown), that is decompressed to a nearly equivalent less densely compressed data (two sets of 2:4 data as shown). In other words, the compressed data format 700 is partially decompressed to the partially decompressed data format 704.

Compressed data format 700 includes an N element data structure 706, where N=2. As shown, the N element data structure 706 includes 2 exemplary values F and E. Compressed data format 700 further includes metadata 708 with 2 exemplary entries indicating where each of the exemplary values E and F are to be copied into the M element data structure 709 (where M=8) when the N element data structure 706 is decompressed into the M element data structure 709.

On the other hand, partially decompressed data format 704 includes two sets of data and metadata, including, for each set, an R element data structure 710A, 712A, where R=2, and corresponding metadata 710B, 712B. Metadata 710B, 712B for each R element data structure 710A, 712A includes 2 exemplary entries indicating where each of the exemplary values in the corresponding R element data structure 710A, 712A are to be copied into a Q element data structure 714A, 714B (where Q=4) when each R element data structure 710A, 712A is decompressed into a corresponding Q element data structure 714A, 714B. Each Q element data structure corresponds with a portion of the M element data structure.

As shown, the first set of data and metadata 710A, 710B for partially decompressed data format 704 corresponds to a first element of the N element data structure (E), and the second set of data and metadata 712A, 712B for partially decompressed data format 704 corresponds to a second element of the N element data structure (F). Thus, the first set of data 710A stores the value of the first element of the N element data structure (E), with one or more additional elements storing zero or another defined source value.

Similarly, the second set of data 712A stores the value of the second element of the N element data structure (F), with one or more additional elements storing zero or another defined source value.

The exemplary embodiment shown follows requirements that metadata 710B, 712B must increase from right to left, with zeros in the R element data structures 710A, 712A corresponding only with elements 1 or 2 in Q element data structure 714A, 714B. Of course, these requirements may entirely depend on the specific fixed function units performing the decompression.

More generally, for N:M densely compressed data, two sets of R:Q nearly equivalent less densely compressed data is generated, where N<=R. For this partial decompression, the R element data structure 710A, 712A and its associated metadata 710B, 712B decompress fully into the corresponding Q element data structure 714A, 714B, where Q<=M and the Q element data structure corresponds to at least a portion of the M element data structure. Hence, the compression ratio between the R element data structure 710A, 712A (holding compressed data) and the Q element data structure 714A, 714B (holding uncompressed data) is R:Q. When both R!=N and Q!=M (where "!=" means "not equal"), the compression ratio R:Q>N:M. Thus the resulting R element data structure 710A, 712A and metadata 710B, 712B represent a less densely compressed data than the N element data structure 706 and metadata 708.

The partially decompressed data format 704 may be useful in certain applications requiring the data to be of a certain size. Further, the extent to which the N element data structure is decompressed may be configured by configuring the size of the R element data structures to which the N element data structure is decompressed.

Figure 8:
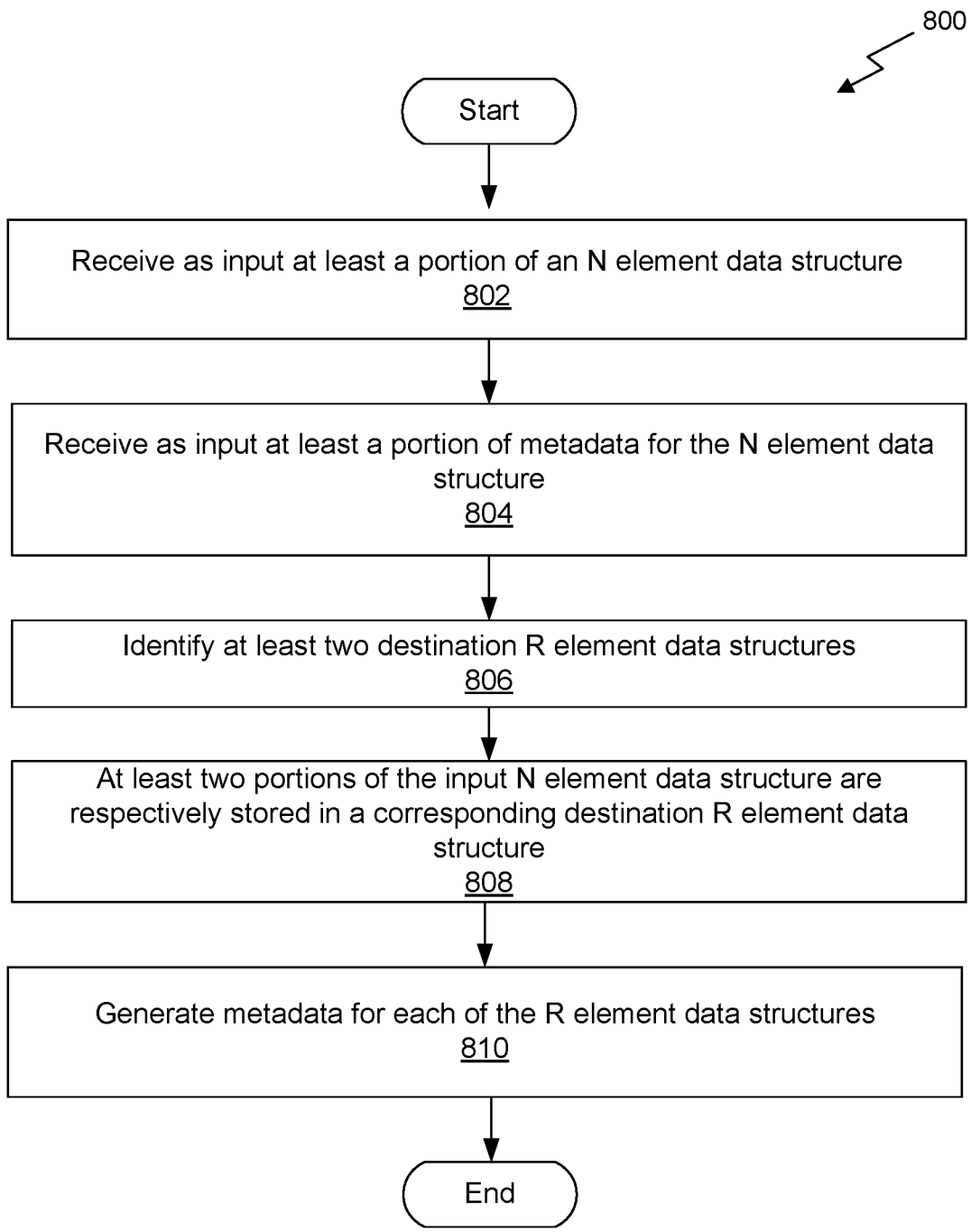
FIG. 8 illustrates an exemplary flowchart for generating less densely compressed data from more densely compressed data by partially decompressing the more densely compressed data.

FIG. 8 illustrates an exemplary flowchart of a method 800 for generating less densely compressed data from more densely compressed data by partially decompressing the more densely compressed data.

In step 802, at least a portion of an N element data structure is received as input. The N element data structure may have been generated by compressing an original M element data structure, where N<M. Thus, the N element data structure may be the same or similar to the N element data structure described in step 302 of FIG. 3.

In step 804, at least a portion of metadata for the N element data structure is received as input. The metadata specifies for each datum in the N element data structure where the datum is to be copied into an M element data structure when decompressing the N element data structure to the M element data structure.

In step 806, at least two destination R element data structures are identified and may be initialized, where N<=R<M. In an embodiment, initializing may include setting all or some of the elements in the destination R element data structure to a predetermined default value (e.g., zero, values from one or more other R element data structures, etc.).

In step 808, at least two portions of the input N element data structure are respectively stored in a corresponding destination R element data structure. Remaining elements of the destination R element data structure may maintain their initialized, or existing, values.

In step 810, metadata is generated for each of the R element data structures. It should be noted that step 810 is an optional step for the present method 800, and in another embodiment may be performed offline or otherwise separately from the method 800. The metadata specifies for each datum in the R element data structure where the datum is to be copied into a Q element data structure when the R element data structure is decompressed to the Q element data structure. In the context of the present embodiment, the R element data structure and its associated metadata decompress fully into the Q element data structure, where Q<=M and the Q element data structure corresponds to at least a portion of the M element data structure. Again, the compression ratio between the R element data structure (holding compressed data) and the Q element data structure (holding uncompressed data) is R:Q. When both R!=N and Q!=M (where "!=" means "not equal"), the compression ratio R:Q>N:M. Thus the resulting set of R element data structures and metadata represent a less densely compressed data than the N element data structure and metadata. In general, when going from N:M to R:Q decompression, then N<=R (e.g., if R:Q=2:4, then N has to be 1 or 2, but if R:Q is 4:8, then N can be 1, 2, 3, or 4 where N:M=4:16 for example).

Method 800 can be performed by a single thread of execution. Alternatively, the method 800 can be performed by a plurality of threads (e.g., 2 (pair) or 4 (quad) threads). In an embodiment, a single thread decompresses all of the input N element data structure. In another embodiment, each of a pair of threads decompresses half of the input N element data structure. In yet another embodiment, each of a quad of threads decompresses a quarter of the input N element data structure.

A format for an exemplary instruction for causing a GPU, CPU, or other computing hardware to perform steps 802-808 of method 800 is shown in Table 1 above, specifically by including the parameter ".partial" in the instruction.

A format for an exemplary instruction for causing a GPU, CPU, or other computing hardware to perform step 810 of method 800 is shown in the following Table 4.

Figure 9:
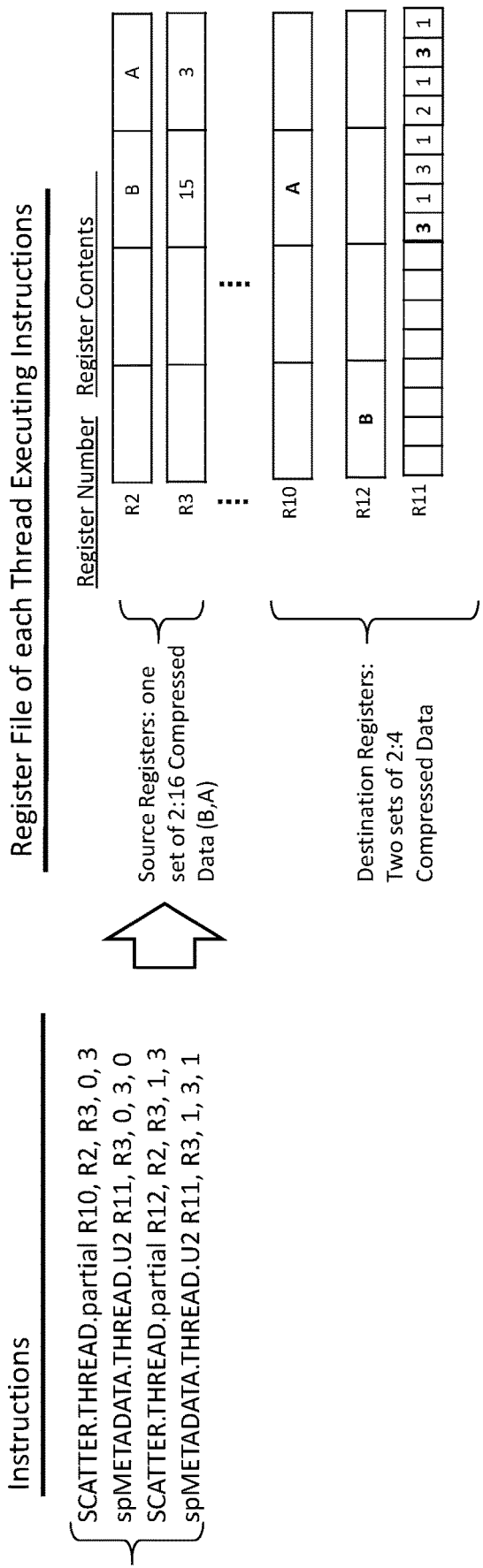
FIG. 9 illustrates an exemplary 2:16 to 2:4 partial decompression instruction.

TABLE 4 spMetadata{.elsize}.mode{.idxSize} Rd, Ra, {Rb,} #VecIdx, {#Mask}, #Dest where:
- {elsize}: optional parameter indicating the number of bits used to represent a datum in the N element data structure (e.g., elsize="8b" for 8 bits, "16b" for 16 bits, etc.); if not provided, SCATTER defaults to 8 bits
- mode: one of "THREAD," "PAIR", or "QUAD" indicating whether all, half, or a quarter, respectively, of Ra should be decompressed by a thread executing this instruction; the particular half or quarter decompressed by a particular thread is based on the particular thread's identification number ("ThreadID")
- {idxSize}: optional parameter indicating the number of bits used to represent an entry in the metadata (e.g., idxSize="U8" for 8 bits, "U4" for 4 bits, "U2" for 2 bits, etc.); if not provided, SCATTER defaults to 8 bits
- Rd: destination register for holding all or portion of the destination R element data structure
- Ra: source register for holding all or a portion of an N element data structure
- {Rb}: source register for holding all or a portion of the metadata for the N element data structure
- #VecIdx: indicates which portion of the destination R element data structure is held in Rd
- {#Mask}: an optional bit mask indicating which portions of Ra will be decompressed
- #Dest: 0, . . . , 7, indicates which is the nibble where the metadata is written to FIG. 9 illustrates an exemplary 2:16 (N:M) to 2:4 (R:Q) partial decompression instruction. In the present example, the partial decompression instruction operates in the "thread" mode described above. In particular, a single thread of execution executes the partial decompression for a particular set of destination registers, where each set of destination registers includes a first register for storing the R element data structure and a second register for storing the corresponding metadata generated for the R element data structure. Thus, in the example shown, 2 sets of instructions, complete the 2:16 to 2:4 partial decompression.

As shown, the first instruction (SCATTER.THREAD.partial R10, R2, R3, 0, 3) indicates that the N element data structure is stored in register R2, the metadata is stored in R3, and at least a portion of the contents of R2 should be decompressed into R10. Further, the 0 value (for #VecIdx) indicates which portion of the uncompressed data structure (M) is held in R10 (where 0 represents elements 0 . . . 7 of M). In the present embodiment, #VecIdx is divided by 2 since the 2 original data values are being put into two destination data structures, one each respectively. The 3 value (for #Mask) indicates the portion of R2 to decompress (where 3 represents the element in the uncompressed data structure (M), which in the case corresponds to the element in N holding the value A). When executed, the first thread of execution copies the value A from register R2 to element 1 in R10. Element 0 in R10 will be a previously initialized value, in on embodiment.

The second instruction (spMETADATA.THREAD.U2 R11, R3, 0, 3, 0) indicates that the metadata for the N element data structure is stored in register R3, and that based on this metadata and the result of the first instruction, new metadata is to be written to register R11 for the data in R10. In the present example, each index in register R11 is 2 bits. Further, the 0 value (for #VecIdx) indicates the subsection of R11 to be written (where 0 represents elements 0 . . . 3). In addition, the 3 value (for #Mask) indicates that element 3 in the uncompressed data is to be included in the partially compressed data, and the final 0 value (for #Dest) indicates the portion of the subsection of R11 to which the metadata for R10 is to be written (where 0 represents element 0 . . . 1 of the indicated subsection of R11). When executed, the first thread of execution writes to R11 the location in the Q element data structure to which the value A in R10 is to be written when decompressed. As shown, the first element of the indicated subsection of R11 can hold the value 0, 1, or 2 and the second element of the indicated subsection of R11 can hold the value 1, 2, or 3, in the present embodiment. Further, in the example shown, the first two elements of the indicated subsection of R11 (elements 0 . . . 1) correspond to a different group (and respective subsection of the Q element data structure) than the second two elements (elements 2 . . . 3), so although elements 0 and 2 both hold the value 1, these elements effectively correspond to different places in the Q element data structure.

The third instruction (SCATTER.THREAD.partial R12, R2, R3, 1, 3) indicates that the N element data structure is stored in register R2, the metadata is stored in R3, and at least a portion of the contents of R2 should be decompressed into R12. Further, the 1 value (for #VecIdx) indicates which portion of the uncompressed data structure (M) is held in R12 (where 1 represents elements 8 . . . 15 of M). The 3 value (for #Mask) indicates the portion of R2 to decompress (where 3, having a binary representation of 11, represents the two first elements of R2). When executed, a second thread of execution copies the value B from register R2 to element 3 in R12. Element 2 in R12 will be a previously initialized value, in on embodiment.

The fourth instruction (spMETADATA.THREAD.U2 R13, R3, 1, 3, 1) indicates that the metadata for the N element data structure is stored in register R3, and that based on this metadata and the result of the third instruction, new metadata is to be written to register R11 for the data in R12. Further, the 1 value (for #VecIdx) indicates the subsection of R11 to be written (where 1 represents elements 4 . . . 7). In addition, the 3 value (for #Mask) indicates that elements 0 and 1 in the uncompressed data are to be included in the partially compressed data, and the final 1 value (for #Dest) indicates the portion of the subsection of R11 to which the metadata for R12 is to be written (where 1 represents element 2 . . . 3 of the indicated subsection of R11). When executed, the second thread of execution writes to R11 the location in the Q element data structure to which the value B in R12 is to be written when decompressed. As shown, the first element of the indicated subsection of R11 can hold the value 0, 1, or 2 and the second element of the indicated subsection of R11 can hold the value 1, 2, or 3, in the present embodiment. Further, in the example shown, the first two elements of the indicated subsection of R11 (elements 0 . . . 1) correspond to a different group (and respective subsection of the Q element data structure) than the second two elements (elements 2 . . . 3), so although elements 0 and 2 both hold the value 1, these elements effectively correspond to different places in the Q element data structure.

Figure 10:
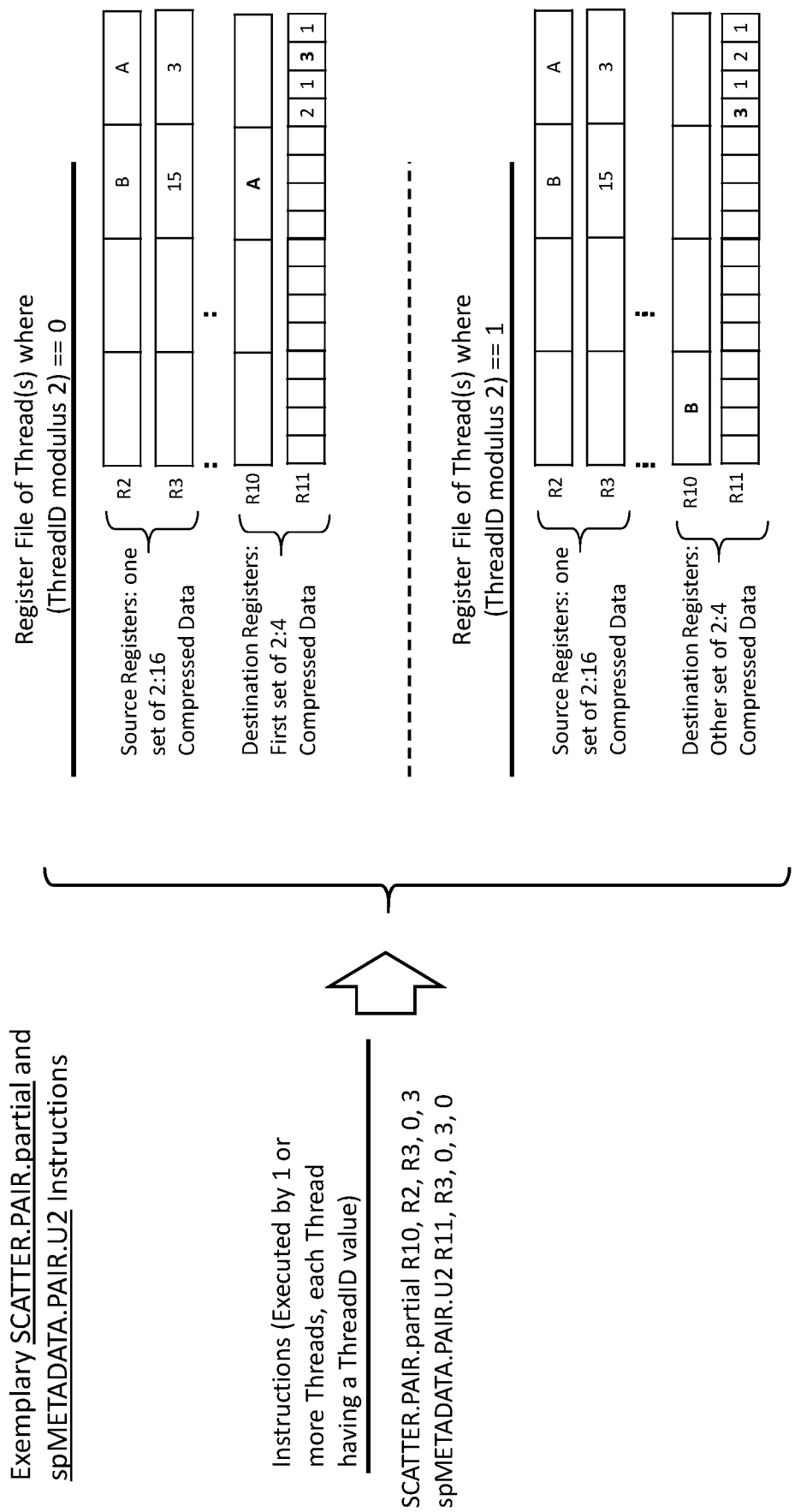
FIG. 10 illustrates an exemplary 2:16 to 2:4 partial decompression instruction operating in PAIR mode.

FIG. 10 illustrates an exemplary 2:16 to 2:4 partial decompression instruction operating in PAIR mode. In PAIR mode, each of a pair of threads can provide partial decompression for half of the N element data structure. In other words, each thread in the pair generates one set of the 2:4 data. In the example shown, each thread operates on its own set of registers.

As shown, the first instruction (SCATTER.PAIR.partial R10, R2, R3, 0, 3) indicates that the N element data structure is stored in register R2, the metadata is stored in R3, at least a portion of the contents of R2 should be decompressed into R10. Further, the 0 value (for #VecIdx) indicates that R10 represents the portion of the destination M element data structure having locations 7 . . . 0 when the thread executing the first instruction has an even ThreadID value (i.e., (ThreadID modulus 2)==0) and locations 15 . . . 8 when the thread executing the first instruction has an odd ThreadID (i.e., (ThreadID modulus 2)==1). The 3 value (for #Mask) indicates the portion of R2 to decompress. When the first instruction is executed by a thread having an even ThreadID value, value A from register R2 is copied to R10. When the first instruction is executed by a thread having an odd ThreadID value, value B from register R2 is copied to R10.

In addition, the second instruction (spMETADATA.PAIR.U2 R11, R3, 0, 3, 0) is executed similarly as described above with reference to FIG. 9, except by the pair of threads in this embodiment. Thus, the thread writing the value A to its copy of R10 will write the new metadata for A in its copy of R11, and the thread writing the value B to its copy of R10 will write the new metadata for B in its copy of R11.

Figure 11:
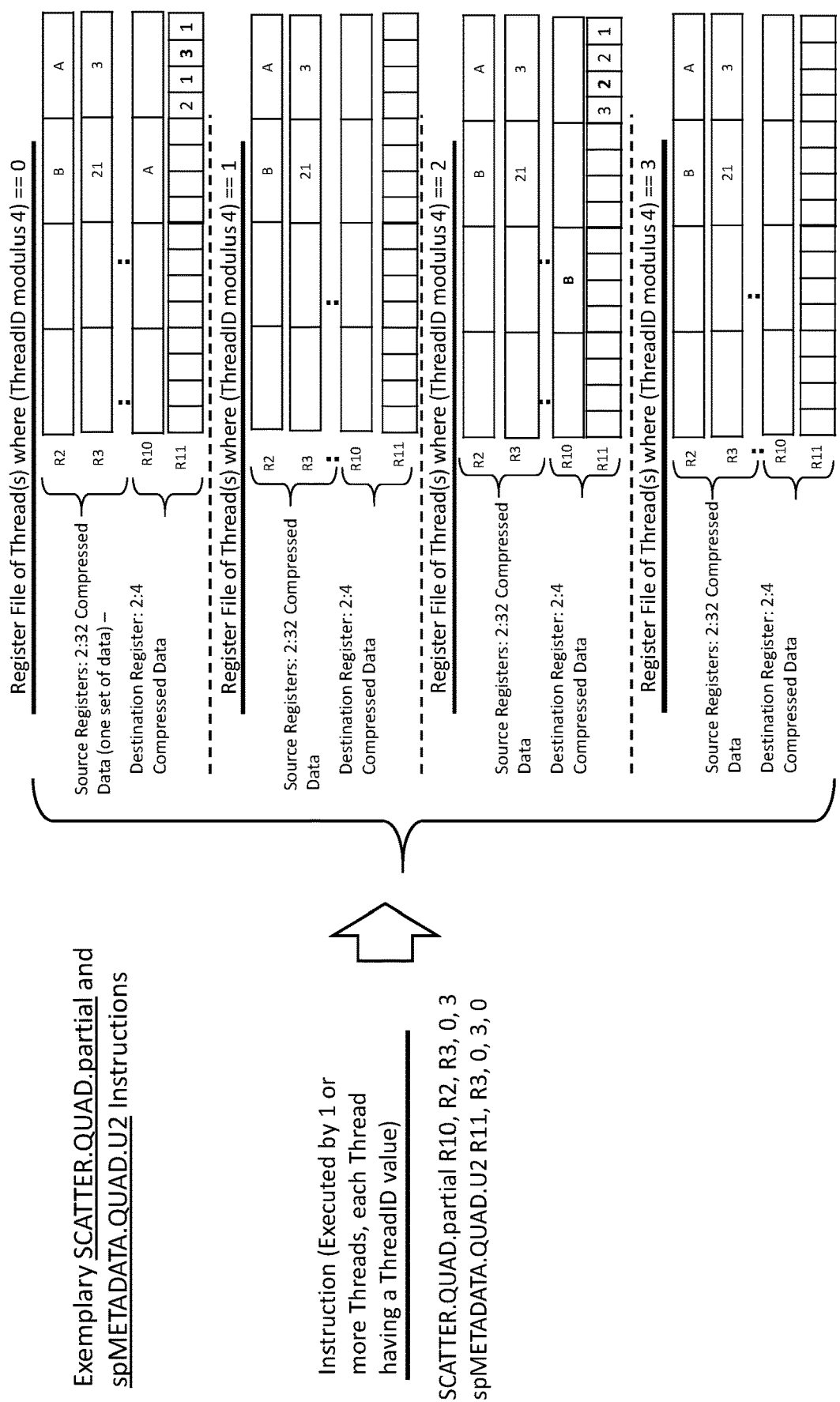
FIG. 11 illustrates an exemplary 2:32 to 2:4 partial decompression instruction operating in QUAD mode.

FIG. 11 illustrates an exemplary 2:32 to 2:4 partial decompression instruction operating in QUAD mode. In QUAD mode, each of a quad of threads can provide partial decompression for a quarter of the N element data structure. In other words, each thread in the quad generates one set of the 2:4 data. In the example shown, each thread operates on its own set of registers.

As shown, the first instruction (SCATTER.QUAD.partial R10, R2, R3, 0, 3) indicates that the N element data structure is stored in register R2, the metadata is stored in R3, and at least a portion of the contents of R2 should be decompressed into R10. Further, the 0 value (for #VecIdx) indicates that R10 represents the portion of the destination M element data structure having locations 7 . . . 0 when the thread executing the first instruction has a first quadrant ThreadID value (i.e., (ThreadID modulus 4)==0), locations 15 . . . 8 when the thread has a second quadrant ThreadID value (i.e., (ThreadID modulus 4)==1), locations 23 . . . 16 when the thread has a third quadrant ThreadID value (i.e., (ThreadID modulus 4)==2), and locations 31 . . . 24 when the thread has a fourth quadrant ThreadID value (i.e., (ThreadID modulus 4)==3). The 3 value (for #Mask) indicates the portion of R2 to decompress.

When the first instruction is executed by a thread having a first quadrant ThreadID, value A from register R2 is copied to R10. Additionally, when the first instruction is executed by a thread having a second quadrant ThreadID, no value from register R2 is copied to R10. When the first instruction is executed by a thread having a third quadrant ThreadID, value B from register R2 is copied to R10. Finally, when the first instruction is executed by a thread having a fourth quadrant ThreadID, no value from register R2 is copied to R10.

In addition, the second instruction (spMETADATA.QUAD.U2 R11, R3, 0, 3, 0) is executed similarly as described above with reference to FIG. 9, except by the quad of threads in this embodiment. Thus, the thread writing the value A to its copy of R10 will write the new metadata for A in its copy of R11, and the thread writing the value B to its copy of R10 will write the new metadata for B in its copy of R11.

Compression of Data

The above description provides embodiments for the complete and partial decompression instructions for data. However, as noted above, these complete and partial decompression instructions operate on N element data structures that have been generated by compressing an M element data structure. The compression may be performed in any way that provides the metadata utilized by the complete and partial decompression instructions.

Parallel Processing Architecture

Figure 12:
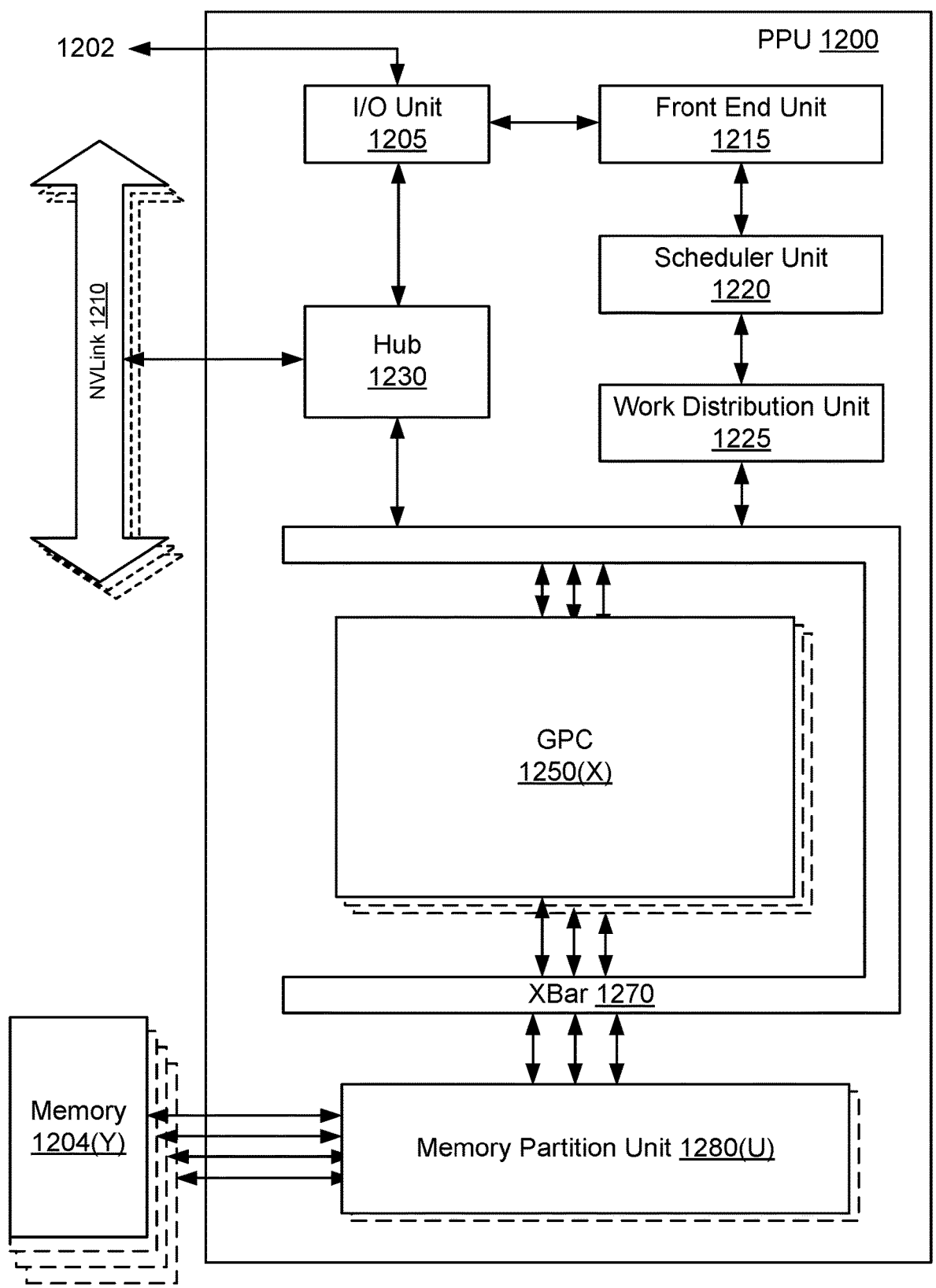
FIG. 12 illustrates a parallel processing unit, in accordance with an embodiment.

FIG. 12 illustrates a parallel processing unit (PPU) 1200, in accordance with an embodiment. In an embodiment, the PPU 1200 is a multi-threaded processor that is implemented on one or more integrated circuit devices. The PPU 1200 is a latency hiding architecture designed to process many threads in parallel. A thread (e.g., a thread of execution) is an instantiation of a set of instructions configured to be executed by the PPU 1200. In an embodiment, the PPU 1200 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 1200 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 1200 may be configured to accelerate thousands of High Performance Computing (HPC), data center, and machine learning applications. The PPU 1200 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 12, the PPU 1200 includes an Input/Output (I/O) unit 1205, a front end unit 1215, a scheduler unit 1220, a work distribution unit 1225, a hub 1230, a crossbar (Xbar) 1270, one or more general processing clusters (GPCs) 1250, and one or more partition units 1280. The PPU 1200 may be connected to a host processor or other PPUs 1200 via one or more high-speed NVLink 1210 interconnect. The PPU 1200 may be connected to a host processor or other peripheral devices via an interconnect 1202. The PPU 1200 may also be connected to a local memory comprising a number of memory devices 1204. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 1210 interconnect enables systems to scale and include one or more PPUs 1200 combined with one or more CPUs, supports cache coherence between the PPUs 1200 and CPUs, and CPU mastering. Data and/or commands may be transmitted by the NVLink 1210 through the hub 1230 to/from other units of the PPU 1200 such as one or more copy engines, a video encoder, a video decoder, a power management unit, etc. (not explicitly shown). The NVLink 1210 is described in more detail in conjunction with FIG. 14B.

The I/O unit 1205 is configured to transmit and receive communications (e.g., commands, data, etc.) from a host processor (not shown) over the interconnect 1202. The I/O unit 1205 may communicate with the host processor directly via the interconnect 1202 or through one or more intermediate devices such as a memory bridge. In an embodiment, the I/O unit 1205 may communicate with one or more other processors, such as one or more the PPUs 1200 via the interconnect 1202. In an embodiment, the I/O unit 1205 implements a Peripheral Component Interconnect Express (PCIe) interface for communications over a PCIe bus and the interconnect 1202 is a PCIe bus. In alternative embodiments, the I/O unit 1205 may implement other types of well-known interfaces for communicating with external devices.

The I/O unit 1205 decodes packets received via the interconnect 1202. In an embodiment, the packets represent commands configured to cause the PPU 1200 to perform various operations. The I/O unit 1205 transmits the decoded commands to various other units of the PPU 1200 as the commands may specify. For example, some commands may be transmitted to the front end unit 1215. Other commands may be transmitted to the hub 1230 or other units of the PPU 1200 such as one or more copy engines, a video encoder, a video decoder, a power management unit, etc. (not explicitly shown). In other words, the I/O unit 1205 is configured to route communications between and among the various logical units of the PPU 1200.

In an embodiment, a program executed by the host processor encodes a command stream in a buffer that provides workloads to the PPU 1200 for processing. A workload may comprise several instructions and data to be processed by those instructions. The buffer is a region in a memory that is accessible (e.g., read/write) by both the host processor and the PPU 1200. For example, the I/O unit 1205 may be configured to access the buffer in a system memory connected to the interconnect 1202 via memory requests transmitted over the interconnect 1202. In an embodiment, the host processor writes the command stream to the buffer and then transmits a pointer to the start of the command stream to the PPU 1200. The front end unit 1215 receives pointers to one or more command streams. The front end unit 1215 manages the one or more streams, reading commands from the streams and forwarding commands to the various units of the PPU 1200.

The front end unit 1215 is coupled to a scheduler unit 1220 that configures the various GPCs 1250 to process tasks defined by the one or more streams. The scheduler unit 1220 is configured to track state information related to the various tasks managed by the scheduler unit 1220. The state may indicate which GPC 1250 a task is assigned to, whether the task is active or inactive, a priority level associated with the task, and so forth. The scheduler unit 1220 manages the execution of a plurality of tasks on the one or more GPCs 1250.

The scheduler unit 1220 is coupled to a work distribution unit 1225 that is configured to dispatch tasks for execution on the GPCs 1250. The work distribution unit 1225 may track a number of scheduled tasks received from the scheduler unit 1220. In an embodiment, the work distribution unit 1225 manages a pending task pool and an active task pool for each of the GPCs 1250. The pending task pool may comprise a number of slots (e.g., 32 slots) that contain tasks assigned to be processed by a particular GPC 1250. The active task pool may comprise a number of slots (e.g., 4 slots) for tasks that are actively being processed by the GPCs 1250. As a GPC 1250 finishes the execution of a task, that task is evicted from the active task pool for the GPC 1250 and one of the other tasks from the pending task pool is selected and scheduled for execution on the GPC 1250. If an active task has been idle on the GPC 1250, such as while waiting for a data dependency to be resolved, then the active task may be evicted from the GPC 1250 and returned to the pending task pool while another task in the pending task pool is selected and scheduled for execution on the GPC 1250.

The work distribution unit 1225 communicates with the one or more GPCs 1250 via XBar 1270. The XBar 1270 is an interconnect network that couples many of the units of the PPU 1200 to other units of the PPU 1200. For example, the XBar 1270 may be configured to couple the work distribution unit 1225 to a particular GPC 1250. Although not shown explicitly, one or more other units of the PPU 1200 may also be connected to the XBar 1270 via the hub 1230.

The tasks are managed by the scheduler unit 1220 and dispatched to a GPC 1250 by the work distribution unit 1225. The GPC 1250 is configured to process the task and generate results. The results may be consumed by other tasks within the GPC 1250, routed to a different GPC 1250 via the XBar 1270, or stored in the memory 1204. The results can be written to the memory 1204 via the partition units 1280, which implement a memory interface for reading and writing data to/from the memory 1204. The results can be transmitted to another PPU 1204 or CPU via the NVLink 1210. In an embodiment, the PPU 1200 includes a number U of partition units 1280 that is equal to the number of separate and distinct memory devices 1204 coupled to the PPU 1200. A partition unit 1280 will be described in more detail below in conjunction with FIG. 13B.

In an embodiment, a host processor executes a driver kernel that implements an application programming interface (API) that enables one or more applications executing on the host processor to schedule operations for execution on the PPU 1200. In an embodiment, multiple compute applications are simultaneously executed by the PPU 1200 and the PPU 1200 provides isolation, quality of service (QoS), and independent address spaces for the multiple compute applications. An application may generate instructions (e.g., API calls) that cause the driver kernel to generate one or more tasks for execution by the PPU 1200. The driver kernel outputs tasks to one or more streams being processed by the PPU 1200. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 14A.

Figure 13A:
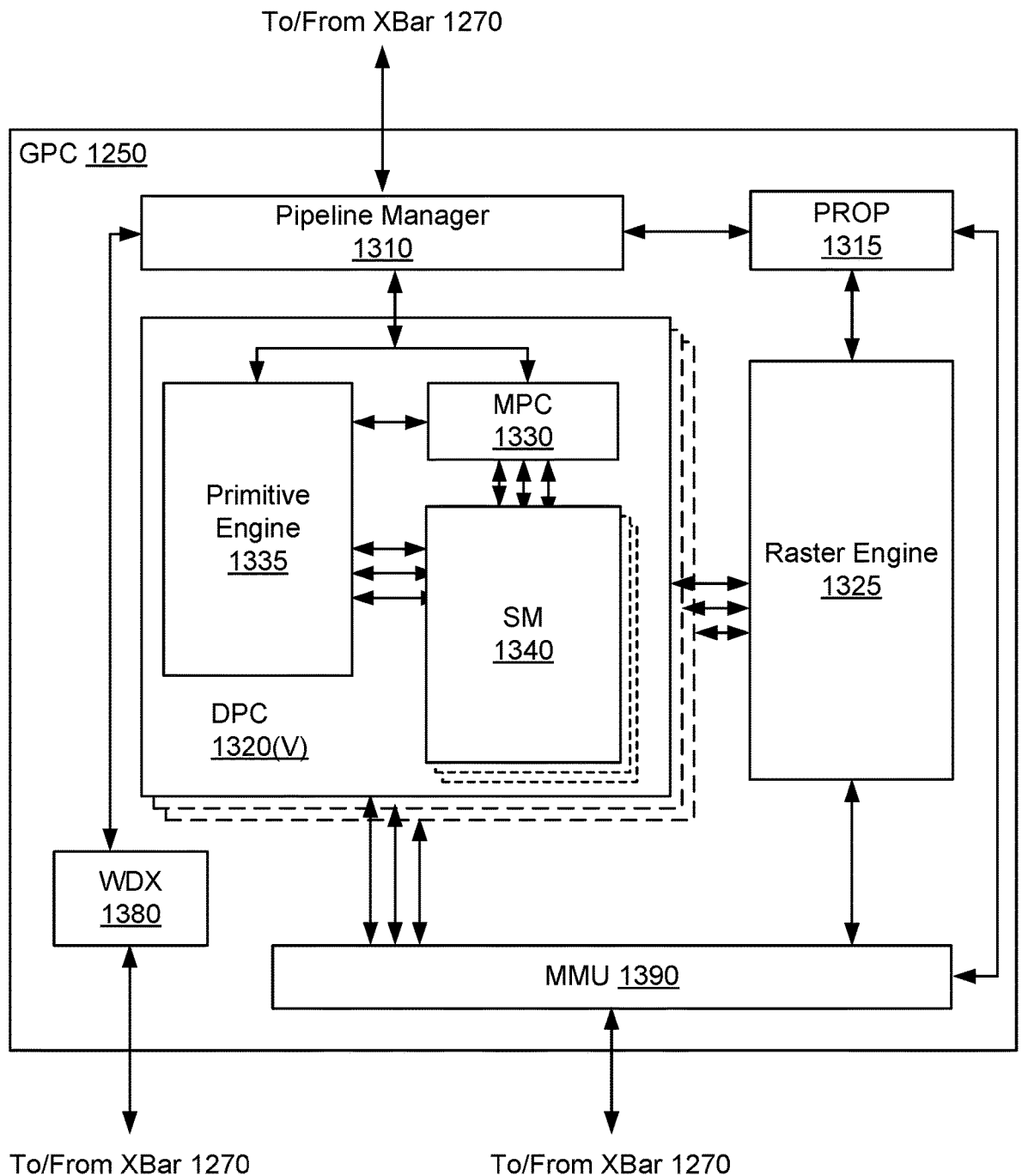
FIG. 13A illustrates a general processing cluster within the parallel processing unit of FIG. 12, in accordance with an embodiment.

FIG. 13A illustrates a GPC 1250 of the PPU 1200 of FIG. 12, in accordance with an embodiment. As shown in FIG. 13A, each GPC 1250 includes a number of hardware units for processing tasks. In an embodiment, each GPC 1250 includes a pipeline manager 1310, a pre-raster operations unit (PROP) 1315, a raster engine 1325, a work distribution crossbar (WDX) 1380, a memory management unit (MMU) 1390, and one or more Data Processing Clusters (DPCs) 1320. It will be appreciated that the GPC 1250 of FIG. 13A may include other hardware units in lieu of or in addition to the units shown in FIG. 13A.

In an embodiment, the operation of the GPC 1250 is controlled by the pipeline manager 1310. The pipeline manager 1310 manages the configuration of the one or more DPCs 1320 for processing tasks allocated to the GPC 1250. In an embodiment, the pipeline manager 1310 may configure at least one of the one or more DPCs 1320 to implement at least a portion of a graphics rendering pipeline. For example, a DPC 1320 may be configured to execute a vertex shader program on the programmable streaming multiprocessor (SM) 1340. The pipeline manager 1310 may also be configured to route packets received from the work distribution unit 1225 to the appropriate logical units within the GPC 1250. For example, some packets may be routed to fixed function hardware units in the PROP 1315 and/or raster engine 1325 while other packets may be routed to the DPCs 1320 for processing by the primitive engine 1335 or the SM 1340. In an embodiment, the pipeline manager 1310 may configure at least one of the one or more DPCs 1320 to implement a neural network model and/or a computing pipeline.

Figure 13B:
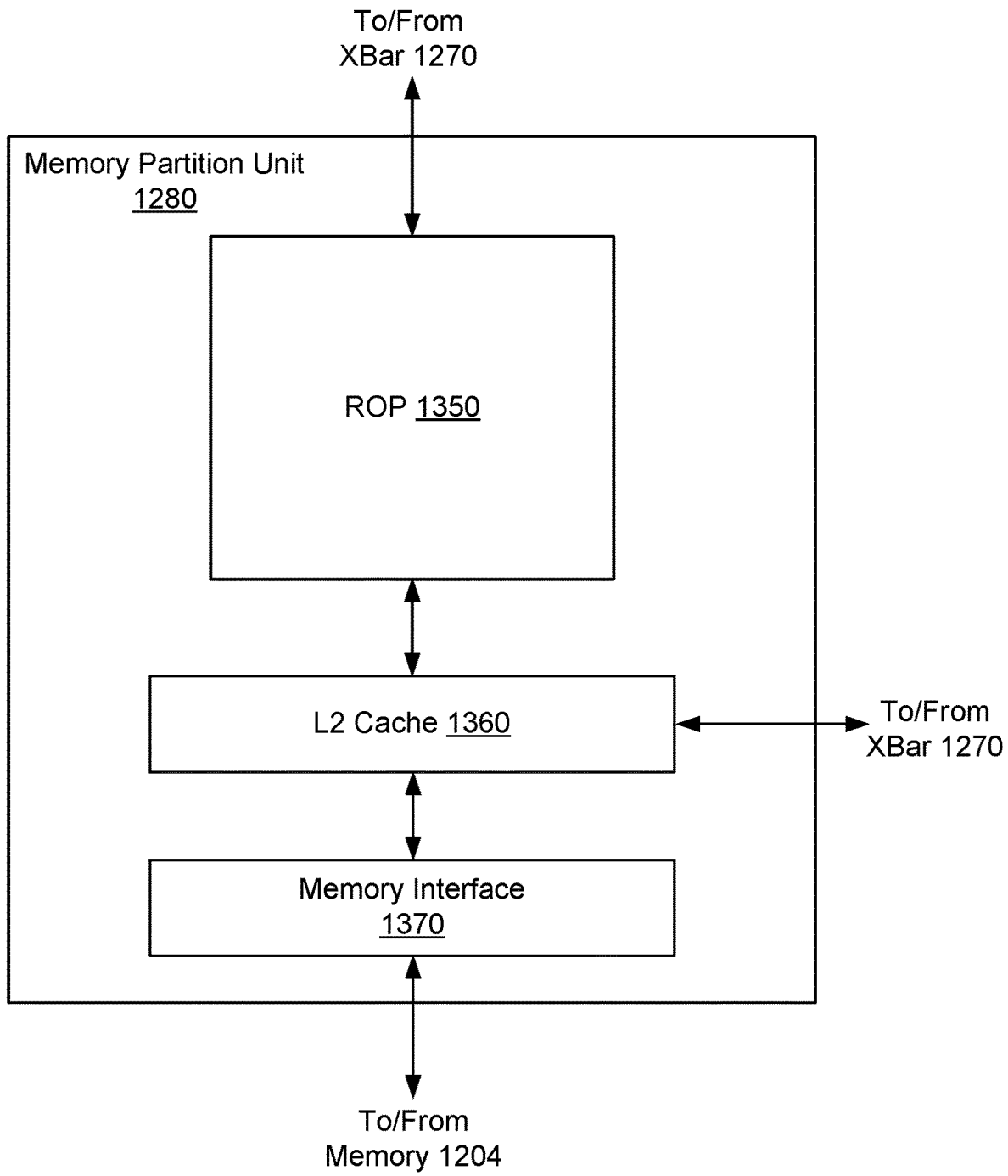
FIG. 13B illustrates a memory partition unit of the parallel processing unit of FIG. 3, in accordance with an embodiment.

The PROP unit 1315 is configured to route data generated by the raster engine 1325 and the DPCs 1320 to a Raster Operations (ROP) unit, described in more detail in conjunction with FIG. 13B. The PROP unit 1315 may also be configured to perform optimizations for color blending, organize pixel data, perform address translations, and the like.

The raster engine 1325 includes a number of fixed function hardware units configured to perform various raster operations. In an embodiment, the raster engine 1325 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 1325 comprises fragments to be processed, for example, by a fragment shader implemented within a DPC 1320.

Each DPC 1320 included in the GPC 1250 includes an M-Pipe Controller (MPC) 1330, a primitive engine 1335, and one or more SMs 1340. The MPC 1330 controls the operation of the DPC 1320, routing packets received from the pipeline manager 1310 to the appropriate units in the DPC 1320. For example, packets associated with a vertex may be routed to the primitive engine 1335, which is configured to fetch vertex attributes associated with the vertex from the memory 1204. In contrast, packets associated with a shader program may be transmitted to the SM 1340.

The SM 1340 comprises a programmable streaming processor that is configured to process tasks represented by a number of threads. Each SM 1340 is multi-threaded and configured to execute a plurality of threads (e.g., 32 threads) from a particular group of threads concurrently. In an embodiment, the SM 1340 implements a SIMD (Single-Instruction, Multiple-Data) architecture where each thread in a group of threads (e.g., a warp) is configured to process a different set of data based on the same set of instructions. All threads in the group of threads execute the same instructions. In another embodiment, the SM 1340 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 1340 will be described in more detail below in conjunction with FIG. 14A.

The MMU 1390 provides an interface between the GPC 1250 and the partition unit 1280. The MMU 1390 may provide translation of virtual addresses into physical addresses, memory protection, and arbitration of memory requests. In an embodiment, the MMU 1390 provides one or more translation lookaside buffers (TLBs) for performing translation of virtual addresses into physical addresses in the memory 1204.

FIG. 13B illustrates a memory partition unit 1280 of the PPU 1200 of FIG. 12, in accordance with an embodiment. As shown in FIG. 13B, the memory partition unit 1280 includes a Raster Operations (ROP) unit 1350, a level two (L2) cache 1360, and a memory interface 1370. The memory interface 1370 is coupled to the memory 1204. Memory interface 1370 may implement 32, 64, 128, 1024-bit data buses, or the like, for high-speed data transfer. In an embodiment, the PPU 1200 incorporates U memory interfaces 1370, one memory interface 1370 per pair of partition units 1280, where each pair of partition units 1280 is connected to a corresponding memory device 1204. For example, PPU 1200 may be connected to up to Y memory devices 1204, such as high bandwidth memory stacks or graphics double-data-rate, version 5, synchronous dynamic random access memory, or other types of persistent storage.

In an embodiment, the memory interface 1370 implements an HBM2 memory interface and Y equals half U. In an embodiment, the HBM2 memory stacks are located on the same physical package as the PPU 1200, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 1204 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 1200 process very large datasets and/or run applications for extended periods.

In an embodiment, the PPU 1200 implements a multi-level memory hierarchy. In an embodiment, the memory partition unit 380 supports a unified memory to provide a single unified virtual address space for CPU and PPU 1200 memory, enabling data sharing between virtual memory systems. In an embodiment the frequency of accesses by a PPU 1200 to memory located on other processors is traced to ensure that memory pages are moved to the physical memory of the PPU 1200 that is accessing the pages more frequently. In an embodiment, the NVLink 1210 supports address translation services allowing the PPU 1200 to directly access a CPU's page tables and providing full access to CPU memory by the PPU 1200.

In an embodiment, copy engines transfer data between multiple PPUs 1200 or between PPUs 1200 and CPUs. The copy engines can generate page faults for addresses that are not mapped into the page tables. The memory partition unit 1280 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 1204 or other system memory may be fetched by the memory partition unit 1280 and stored in the L2 cache 1360, which is located on-chip and is shared between the various GPCs 1250. As shown, each memory partition unit 1280 includes a portion of the L2 cache 1360 associated with a corresponding memory device 1204. Lower level caches may then be implemented in various units within the GPCs 1250. For example, each of the SMs 1340 may implement a level one (L1) cache. The L1 cache is private memory that is dedicated to a particular SM 1340. Data from the L2 cache 1360 may be fetched and stored in each of the L1 caches for processing in the functional units of the SMs 1340. The L2 cache 1360 is coupled to the memory interface 1370 and the XBar 1270.

The ROP unit 1350 performs graphics raster operations related to pixel color, such as color compression, pixel blending, and the like. The ROP unit 1350 also implements depth testing in conjunction with the raster engine 1325, receiving a depth for a sample location associated with a pixel fragment from the culling engine of the raster engine 1325. The depth is tested against a corresponding depth in a depth buffer for a sample location associated with the fragment. If the fragment passes the depth test for the sample location, then the ROP unit 1350 updates the depth buffer and transmits a result of the depth test to the raster engine 1325. It will be appreciated that the number of partition units 1280 may be different than the number of GPCs 1250 and, therefore, each ROP unit 1350 may be coupled to each of the GPCs 1250. The ROP unit 1350 tracks packets received from the different GPCs 1250 and determines which GPC 1250 that a result generated by the ROP unit 1350 is routed to through the Xbar 1270. Although the ROP unit 1350 is included within the memory partition unit 1280 in FIG. 13B, in other embodiment, the ROP unit 1350 may be outside of the memory partition unit 1280. For example, the ROP unit 1350 may reside in the GPC 1250 or another unit.

Figure 14A:
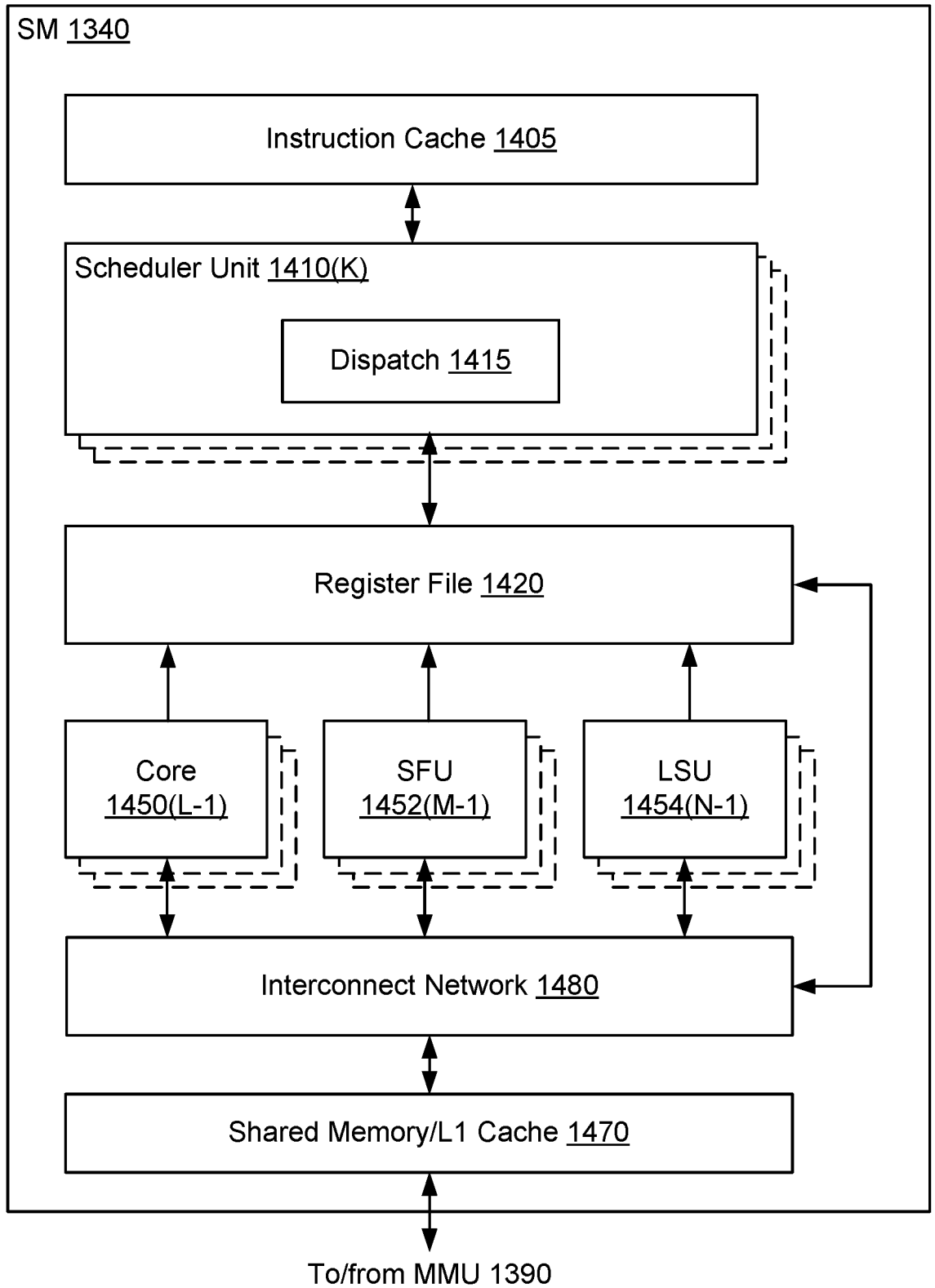
FIG. 14A illustrates the streaming multi-processor of FIG. 13A, in accordance with an embodiment.

FIG. 14A illustrates the streaming multi-processor 1340 of FIG. 13A, in accordance with an embodiment. As shown in FIG. 14A, the SM 1340 includes an instruction cache 1405, one or more scheduler units 1410, a register file 1420, one or more processing cores 1450, one or more special function units (SFUs) 1452, one or more load/store units (LSUs) 1454, an interconnect network 1480, a shared memory/L1 cache 1470.

As described above, the work distribution unit 1225 dispatches tasks for execution on the GPCs 1250 of the PPU 1200. The tasks are allocated to a particular DPC 1320 within a GPC 1250 and, if the task is associated with a shader program, the task may be allocated to an SM 1340. The scheduler unit 1410 receives the tasks from the work distribution unit 1225 and manages instruction scheduling for one or more thread blocks assigned to the SM 1340. The scheduler unit 1410 schedules thread blocks for execution as warps of parallel threads, where each thread block is allocated at least one warp. In an embodiment, each warp executes 32 threads. The scheduler unit 1410 may manage a plurality of different thread blocks, allocating the warps to the different thread blocks and then dispatching instructions from the plurality of different cooperative groups to the various functional units (e.g., cores 1450, SFUs 1452, and LSUs 1454) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 1415 is configured to transmit instructions to one or more of the functional units. In the embodiment, the scheduler unit 1410 includes two dispatch units 1415 that enable two different instructions from the same warp to be dispatched during each clock cycle. In alternative embodiments, each scheduler unit 1410 may include a single dispatch unit 1415 or additional dispatch units 1415.

Each SM 1340 includes a register file 1420 that provides a set of registers for the functional units of the SM 1340. In an embodiment, the register file 1420 is divided between each of the functional units such that each functional unit is allocated a dedicated portion of the register file 1420. In another embodiment, the register file 1420 is divided between the different warps being executed by the SM 1340. The register file 1420 provides temporary storage for operands connected to the data paths of the functional units.

Each SM 1340 comprises L processing cores 1450. In an embodiment, the SM 1340 includes a large number (e.g., 128, etc.) of distinct processing cores 1450. Each core 1450 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 1450 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 1450. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A×B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 1340 also comprises M SFUs 1452 that perform special functions (e.g., attribute evaluation, reciprocal square root, and the like). In an embodiment, the SFUs 1452 may include a tree traversal unit configured to traverse a hierarchical tree data structure. In an embodiment, the SFUs 1452 may include texture unit configured to perform texture map filtering operations. In an embodiment, the texture units are configured to load texture maps (e.g., a 2D array of texels) from the memory 1204 and sample the texture maps to produce sampled texture values for use in shader programs executed by the SM 1340. In an embodiment, the texture maps are stored in the shared memory/L1 cache 1370. The texture units implement texture operations such as filtering operations using mip-maps (e.g., texture maps of varying levels of detail). In an embodiment, each SM 1240 includes two texture units.

Each SM 1340 also comprises N LSUs 1454 that implement load and store operations between the shared memory/L1 cache 1470 and the register file 1420. Each SM 1340 includes an interconnect network 1480 that connects each of the functional units to the register file 1420 and the LSU 1454 to the register file 1420, shared memory/L1 cache 1470. In an embodiment, the interconnect network 1480 is a crossbar that can be configured to connect any of the functional units to any of the registers in the register file 1420 and connect the LSUs 1454 to the register file and memory locations in shared memory/L1 cache 1470.

The shared memory/L1 cache 1470 is an array of on-chip memory that allows for data storage and communication between the SM 1340 and the primitive engine 1335 and between threads in the SM 1340. In an embodiment, the shared memory/L1 cache 1470 comprises 128 KB of storage capacity and is in the path from the SM 1340 to the partition unit 1280. The shared memory/L1 cache 1470 can be used to cache reads and writes. One or more of the shared memory/L1 cache 1470, L2 cache 1360, and memory 1204 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1470 enables the shared memory/L1 cache 1470 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 12, are bypassed, creating a much simpler programming model. In the general purpose parallel computation configuration, the work distribution unit 1225 assigns and distributes blocks of threads directly to the DPCs 1320. The threads in a block execute the same program, using a unique thread ID in the calculation to ensure each thread generates unique results, using the SM 1340 to execute the program and perform calculations, shared memory/L1 cache 1470 to communicate between threads, and the LSU 1454 to read and write global memory through the shared memory/L1 cache 1470 and the memory partition unit 1280. When configured for general purpose parallel computation, the SM 1340 can also write commands that the scheduler unit 1220 can use to launch new work on the DPCs 1320.

The PPU 1200 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the PPU 1200 is embodied on a single semiconductor substrate. In another embodiment, the PPU 1200 is included in a system-on-a-chip (SoC) along with one or more other devices such as additional PPUs 1200, the memory 1204, a reduced instruction set computer (RISC) CPU, a memory management unit (MMU), a digital-to-analog converter (DAC), and the like.

In an embodiment, the PPU 1200 may be included on a graphics card that includes one or more memory devices 1204. The graphics card may be configured to interface with a PCIe slot on a motherboard of a desktop computer. In yet another embodiment, the PPU 1200 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 14B:
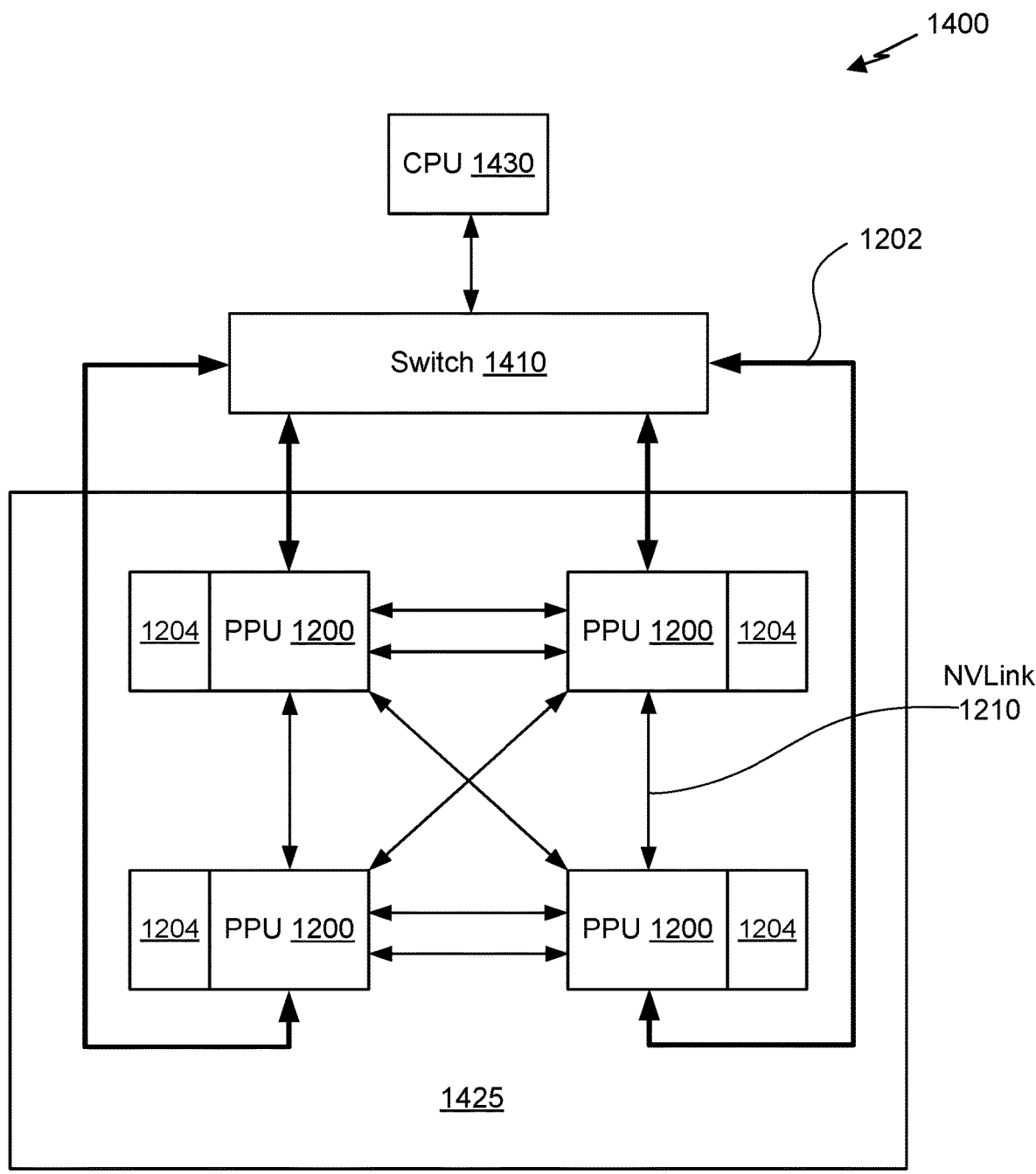
FIG. 14B is a conceptual diagram of a processing system implemented using the PPU of FIG. 12, in accordance with an embodiment.

FIG. 14B is a conceptual diagram of a processing system 1400 implemented using the PPU 1200 of FIG. 12, in accordance with an embodiment. The exemplary system 1465 may be configured to implement the method 100 shown in FIG. 1A and/or the method 200 shown in FIG. 2A. The processing system 1400 includes a CPU 1430, switch 1410, and multiple PPUs 1200 each and respective memories 1204. The NVLink 1210 provides high-speed communication links between each of the PPUs 1200. Although a particular number of NVLink 1210 and interconnect 1202 connections are illustrated in FIG. 14B, the number of connections to each PPU 1200 and the CPU 1430 may vary. The switch 1410 interfaces between the interconnect 1202 and the CPU 1430. The PPUs 1200, memories 1204, and NVLinks 1210 may be situated on a single semiconductor platform to form a parallel processing module 1425. In an embodiment, the switch 1410 supports two or more protocols to interface between various different connections and/or links.

In another embodiment (not shown), the NVLink 1210 provides one or more high-speed communication links between each of the PPUs 1200 and the CPU 1430 and the switch 1410 interfaces between the interconnect 1202 and each of the PPUs 1200. The PPUs 1200, memories 1204, and interconnect 1202 may be situated on a single semiconductor platform to form a parallel processing module 1425. In yet another embodiment (not shown), the interconnect 1202 provides one or more communication links between each of the PPUs 1200 and the CPU 1430 and the switch 1410 interfaces between each of the PPUs 1200 using the NVLink 1210 to provide one or more high-speed communication links between the PPUs 1200. In another embodiment (not shown), the NVLink 1210 provides one or more high-speed communication links between the PPUs 1200 and the CPU 1430 through the switch 1410. In yet another embodiment (not shown), the interconnect 1202 provides one or more communication links between each of the PPUs 1200 directly. One or more of the NVLink 1210 high-speed communication links may be implemented as a physical NVLink interconnect or either an on-chip or on-die interconnect using the same protocol as the NVLink 1210.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 1425 may be implemented as a circuit board substrate and each of the PPUs 1200 and/or memories 1204 may be packaged devices. In an embodiment, the CPU 1430, switch 1410, and the parallel processing module 1425 are situated on a single semiconductor platform.

In an embodiment, the signaling rate of each NVLink 1210 is 20 to 25 Gigabits/second and each PPU 1200 includes six NVLink 1210 interfaces (as shown in FIG. 14B, five NVLink 1210 interfaces are included for each PPU 1200). Each NVLink 1210 provides a data transfer rate of 25 Gigabytes/second in each direction, with six links providing 1200 Gigabytes/second. The NVLinks 1210 can be used exclusively for PPU-to-PPU communication as shown in FIG. 14B, or some combination of PPU-to-PPU and PPU-to-CPU, when the CPU 1430 also includes one or more NVLink 1210 interfaces.

In an embodiment, the NVLink 1210 allows direct load/store/atomic access from the CPU 1430 to each PPU's 1200 memory 1204. In an embodiment, the NVLink 1210 supports coherency operations, allowing data read from the memories 1204 to be stored in the cache hierarchy of the CPU 1430, reducing cache access latency for the CPU 1430. In an embodiment, the NVLink 1210 includes support for Address Translation Services (ATS), allowing the PPU 1200 to directly access page tables within the CPU 1430. One or more of the NVLinks 1210 may also be configured to operate in a low-power mode.

Figure 14C:
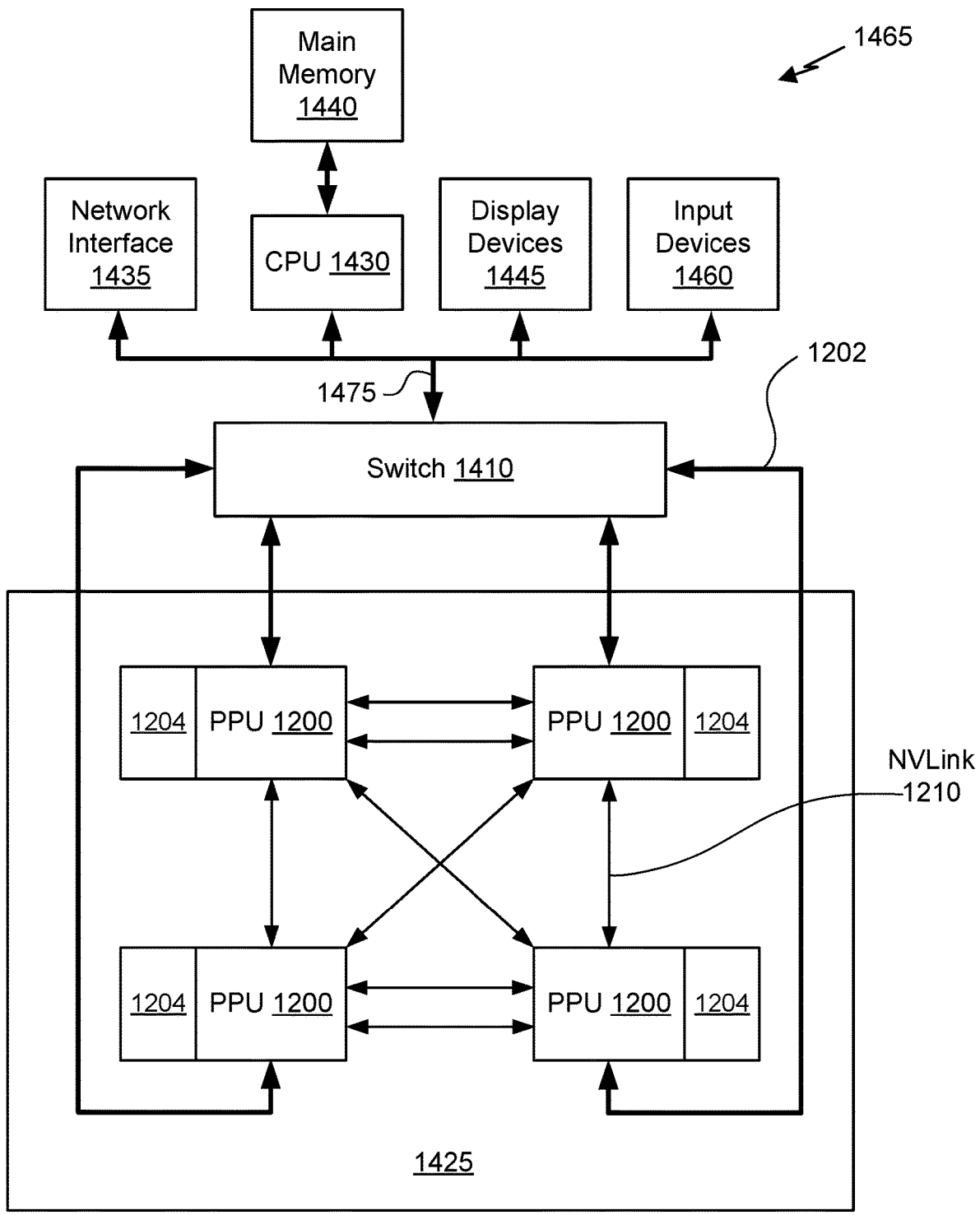
FIG. 14C illustrates an exemplary system in which the various architecture and/or functionality of the various previous embodiments may be implemented.

FIG. 14C illustrates an exemplary system 1465 in which the various architecture and/or functionality of the various previous embodiments may be implemented. The exemplary system 1465 may be configured to implement the method 100 shown in FIG. 1A and/or the method 200 shown in FIG. 2A.

As shown, a system 1465 is provided including at least one central processing unit 1430 that is connected to a communication bus 1475. The communication bus 1475 may be implemented using any suitable protocol, such as PCI (Peripheral Component Interconnect), PCI-Express, AGP (Accelerated Graphics Port), HyperTransport, or any other bus or point-to-point communication protocol(s). The system 1465 also includes a main memory 1440. Control logic (software) and data are stored in the main memory 1440 which may take the form of random access memory (RAM).

The system 1465 also includes input devices 1460, the parallel processing system 1425, and display devices 1445, e.g. a conventional CRT (cathode ray tube), LCD (liquid crystal display), LED (light emitting diode), plasma display or the like. User input may be received from the input devices 1460, e.g., keyboard, mouse, touchpad, microphone, and the like. Each of the foregoing modules and/or devices may even be situated on a single semiconductor platform to form the system 1465. Alternately, the various modules may also be situated separately or in various combinations of semiconductor platforms per the desires of the user.

Further, the system 1465 may be coupled to a network (e.g., a telecommunications network, local area network (LAN), wireless network, wide area network (WAN) such as the Internet, peer-to-peer network, cable network, or the like) through a network interface 1435 for communication purposes.

The system 1465 may also include a secondary storage (not shown). The secondary storage 1510 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1440 and/or the secondary storage. Such computer programs, when executed, enable the system 1465 to perform various functions. The memory 1440, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the system 1465 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

In an embodiment, the PPU 1200 comprises a graphics processing unit (GPU). The PPU 1200 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 1200 can be configured to process the graphics primitives to generate a frame buffer (e.g., pixel data for each of the pixels of the display).

An application writes model data for a scene (e.g., a collection of vertices and attributes) to a memory such as a system memory or memory 1204. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 1340 of the PPU 1200 including one or more of a vertex shader, hull shader, domain shader, geometry shader, and a pixel shader. For example, one or more of the SMs 1340 may be configured to execute a vertex shader program that processes a number of vertices defined by the model data. In an embodiment, the different SMs 1340 may be configured to execute different shader programs concurrently. For example, a first subset of SMs 1340 may be configured to execute a vertex shader program while a second subset of SMs 1340 may be configured to execute a pixel shader program. The first subset of SMs 1340 processes vertex data to produce processed vertex data and writes the processed vertex data to the L2 cache 1360 and/or the memory 1204. After the processed vertex data is rasterized (e.g., transformed from three-dimensional data into two-dimensional data in screen space) to produce fragment data, the second subset of SMs 1340 executes a pixel shader to produce processed fragment data, which is then blended with other processed fragment data and written to the frame buffer in memory 1204. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Figure 15:
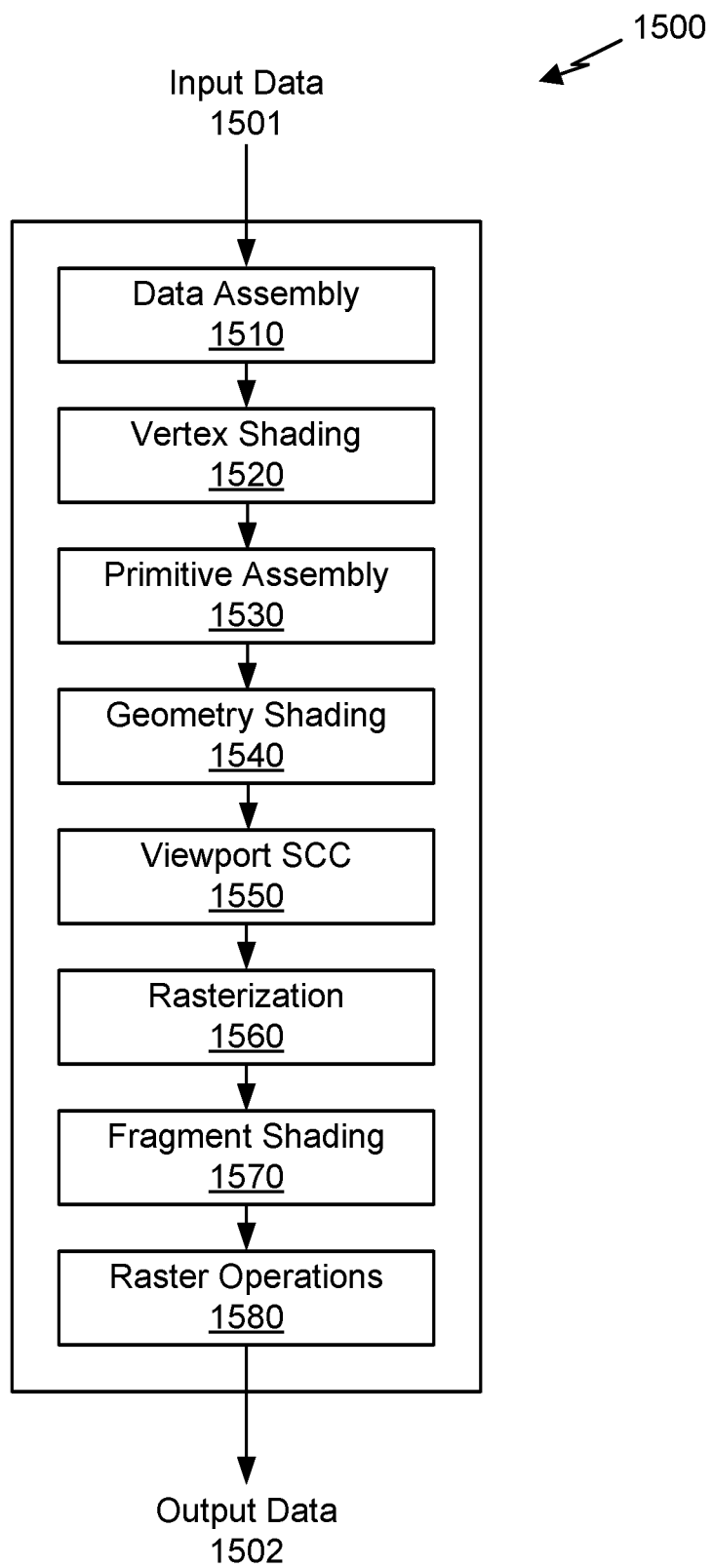
FIG. 15 is a conceptual diagram of a graphics processing pipeline implemented by the PPU of FIG. 12, in accordance with an embodiment.

FIG. 15 is a conceptual diagram of a graphics processing pipeline 1500 implemented by the PPU 1200 of FIG. 12, in accordance with an embodiment. The graphics processing pipeline 1500 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1500 receives input data 1501 that is transmitted from one stage to the next stage of the graphics processing pipeline 1500 to generate output data 1502. In an embodiment, the graphics processing pipeline 1500 may represent a graphics processing pipeline defined by the OpenGL® API. As an option, the graphics processing pipeline 1500 may be implemented in the context of the functionality and architecture of the previous Figures and/or any subsequent Figure(s).

As shown in FIG. 15, the graphics processing pipeline 1500 comprises a pipeline architecture that includes a number of stages. The stages include, but are not limited to, a data assembly stage 1510, a vertex shading stage 1520, a primitive assembly stage 1530, a geometry shading stage 1540, a viewport scale, cull, and clip (VSCC) stage 1550, a rasterization stage 1560, a fragment shading stage 1570, and a raster operations stage 1580. In an embodiment, the input data 1501 comprises commands that configure the processing units to implement the stages of the graphics processing pipeline 1500 and geometric primitives (e.g., points, lines, triangles, quads, triangle strips or fans, etc.) to be processed by the stages. The output data 1502 may comprise pixel data (e.g., color data) that is copied into a frame buffer or other type of surface data structure in a memory.

The data assembly stage 1510 receives the input data 1501 that specifies vertex data for high-order surfaces, primitives, or the like. The data assembly stage 1510 collects the vertex data in a temporary storage or queue, such as by receiving a command from the host processor that includes a pointer to a buffer in memory and reading the vertex data from the buffer. The vertex data is then transmitted to the vertex shading stage 1520 for processing.

The vertex shading stage 1520 processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading stage 1520 may manipulate individual vertex attributes such as position, color, texture coordinates, and the like. In other words, the vertex shading stage 1520 performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading stage 1520 generates transformed vertex data that is transmitted to the primitive assembly stage 1530.

The primitive assembly stage 1530 collects vertices output by the vertex shading stage 1520 and groups the vertices into geometric primitives for processing by the geometry shading stage 1540. For example, the primitive assembly stage 1530 may be configured to group every three consecutive vertices as a geometric primitive (e.g., a triangle) for transmission to the geometry shading stage 1540. In some embodiments, specific vertices may be reused for consecutive geometric primitives (e.g., two consecutive triangles in a triangle strip may share two vertices). The primitive assembly stage 1530 transmits geometric primitives (e.g., a collection of associated vertices) to the geometry shading stage 1540.

The geometry shading stage 1540 processes geometric primitives by performing a set of operations (e.g., a geometry shader or program) on the geometric primitives. Tessellation operations may generate one or more geometric primitives from each geometric primitive. In other words, the geometry shading stage 1540 may subdivide each geometric primitive into a finer mesh of two or more geometric primitives for processing by the rest of the graphics processing pipeline 1500. The geometry shading stage 1540 transmits geometric primitives to the viewport SCC stage 1550.

In an embodiment, the graphics processing pipeline 1500 may operate within a streaming multiprocessor and the vertex shading stage 1520, the primitive assembly stage 1530, the geometry shading stage 1540, the fragment shading stage 1570, and/or hardware/software associated therewith, may sequentially perform processing operations. Once the sequential processing operations are complete, in an embodiment, the viewport SCC stage 1550 may utilize the data. In an embodiment, primitive data processed by one or more of the stages in the graphics processing pipeline 1500 may be written to a cache (e.g. L1 cache, a vertex cache, etc.). In this case, in an embodiment, the viewport SCC stage 1550 may access the data in the cache. In an embodiment, the viewport SCC stage 1550 and the rasterization stage 1560 are implemented as fixed function circuitry.

The viewport SCC stage 1550 performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization stage 1560.

The rasterization stage 1560 converts the 3D geometric primitives into 2D fragments (e.g. capable of being utilized for display, etc.). The rasterization stage 1560 may be configured to utilize the vertices of the geometric primitives to setup a set of plane equations from which various attributes can be interpolated. The rasterization stage 1560 may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization stage 1560 generates fragment data (e.g., interpolated vertex attributes associated with a particular sample location for each covered pixel) that are transmitted to the fragment shading stage 1570.

The fragment shading stage 1570 processes fragment data by performing a set of operations (e.g., a fragment shader or a program) on each of the fragments. The fragment shading stage 1570 may generate pixel data (e.g., color values) for the fragment such as by performing lighting operations or sampling texture maps using interpolated texture coordinates for the fragment. The fragment shading stage 1570 generates pixel data that is transmitted to the raster operations stage 1580.

The raster operations stage 1580 may perform various operations on the pixel data such as performing alpha tests, stencil tests, and blending the pixel data with other pixel data corresponding to other fragments associated with the pixel. When the raster operations stage 1580 has finished processing the pixel data (e.g., the output data 1502), the pixel data may be written to a render target such as a frame buffer, a color buffer, or the like.

It will be appreciated that one or more additional stages may be included in the graphics processing pipeline 1500 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading stage 1540). Other types of graphics processing pipelines are contemplated as being within the scope of the present disclosure. Furthermore, any of the stages of the graphics processing pipeline 1500 may be implemented by one or more dedicated hardware units within a graphics processor such as PPU 1200. Other stages of the graphics processing pipeline 1500 may be implemented by programmable hardware units such as the SM 1340 of the PPU 1200.

The graphics processing pipeline 1500 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the PPU 1200. The API provides an abstraction for a programmer that lets a programmer utilize specialized graphics hardware, such as the PPU 1200, to generate the graphical data without requiring the programmer to utilize the specific instruction set for the PPU 1200. The application may include an API call that is routed to the device driver for the PPU 1200. The device driver interprets the API call and performs various operations to respond to the API call. In some instances, the device driver may perform operations by executing instructions on the CPU. In other instances, the device driver may perform operations, at least in part, by launching operations on the PPU 1200 utilizing an input/output interface between the CPU and the PPU 1200. In an embodiment, the device driver is configured to implement the graphics processing pipeline 1500 utilizing the hardware of the PPU 1200.

Various programs may be executed within the PPU 1200 in order to implement the various stages of the graphics processing pipeline 1500. For example, the device driver may launch a kernel on the PPU 1200 to perform the vertex shading stage 1520 on one SM 1340 (or multiple SMs 1340). The device driver (or the initial kernel executed by the PPU 1300) may also launch other kernels on the PPU 1300 to perform other stages of the graphics processing pipeline 1500, such as the geometry shading stage 1540 and the fragment shading stage 1570. In addition, some of the stages of the graphics processing pipeline 1500 may be implemented on fixed unit hardware such as a rasterizer or a data assembler implemented within the PPU 1300. It will be appreciated that results from one kernel may be processed by one or more intervening fixed function hardware units before being processed by a subsequent kernel on an SM 1340.

Machine Learning

Deep neural networks (DNNs) developed on processors, such as the PPU 1200 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected nodes (e.g., perceptrons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 1200. Inferencing is less compute-intensive than training, being a latency-sensitive process where a trained neural network is applied to new inputs it has not seen before to classify images, translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 1200 is a computing platform capable of delivering performance required for deep neural network-based artificial intelligence and machine learning applications.

What is claimed is:

1. A method for decompressing compressed data, comprising:
   receiving as input at least a portion of an N element data structure, the N element data structure being a data structure having N number of elements,
   where the N element data structure was generated by compressing an original M element data structure, the original M element data structure being a data structure having M number of elements,
   where each element in the N element data structure holds a value, and
   where N<M;
   receiving as input at least a portion of metadata associated with the N element data structure, the metadata specifying for each value in the N element data structure one of the M elements of the original M element data structure in which the value originated;
   identifying at least a portion of a destination M element data structure, the destination M element data structure being a destination data structure having M number of elements; and
   executing at least one instruction to decompress at least a portion of the N element data structure into the destination M element data structure by:
      identifying one or more values of the N element data structure to be written to the destination M element data structure, determining, from the input metadata for each of the one or more values of the N element data structure, in which one of the M elements of the original M element data structure the value of the N element data structure originated, and writing each of the one or more values of the N element data structure to an element of the destination M element data structure that corresponds to the one of the M elements of the original M element data structure in which the value of the N element data structure originated.

2. The method of claim 1, wherein:

the N element data structure is a N element vector and wherein the M element data structure is a M element vector, or the N element data structure is a N element tensor and wherein the M element data structure is a M element tensor.

3. The method of claim 1, wherein identifying the destination M element data structure further includes initializing the destination M element data structure by setting each element in the destination M element data structure to zero.

4. The method of claim 1, wherein identifying the destination M element data structure further includes initializing the destination M element data structure by setting each element in the destination M element data structure to values from another M element data structure.

5. The method of claim 1, wherein identifying the destination M element data structure further includes initializing the destination M element data structure by setting each element in the destination M element data structure to values from a selection of M number of elements from a group of data structures.

6. The method of claim 1, wherein executing at least one instruction includes executing an instruction from a single thread or in a single execution lane.

7. The method of claim 6, wherein the single thread or execution lane uses a single instance of the destination M element data structure.

8. The method of claim 1, wherein executing at least one instruction includes executing an instruction from a plurality of threads or in multiple execution lanes.

9. The method of claim 8, wherein the plurality of threads or execution lanes are split into groups and each group uses a different instance of the destination M element data structure.

10. The method of claim 8, wherein the plurality of threads or execution lanes share at least one of:

a single instance of the N element data structure, and a single instance of the destination M element data structure.

11. A non-transitory computer readable medium storing code executable by a processor to perform a method for decompressing compressed data comprising:

receiving as input at least a portion of an N element data structure, the N element data structure being a data structure having N number of elements, where the N element data structure was generated by compressing an original M element data structure, the original M element data structure being a data structure having M number of elements, where each element in the N element data structure holds a value, and where N<M;

receiving as input at least a portion of metadata associated with the N element data structure, the metadata specifying for each value in the N element data structure one of the M elements of the original M element data structure in which the value originated;

identifying at least a portion of a destination M element data structure, the destination M element data structure being a destination data structure having M number of elements; and executing at least one instruction to decompress at least a portion of the N element data structure into the destination M element data structure by:

identifying one or more values of the N element data structure to be written to the destination M element data structure, determining, from the input metadata for each of the one or more values of the N element data structure, in which one of the M elements of the original M element data structure the value of the N element data structure originated, and writing each of the one or more values of the N element data structure to an element of the destination M element data structure that corresponds to the one of the M elements of the original M element data structure in which the value of the N element data structure originated.

12. A system for decompressing compressed data comprising:

a memory; and at least one processor for:

receiving as input at least a portion of an N element data structure, the N element data structure being a data structure having N number of elements, where the N element data structure was generated by compressing an original M element data structure, the original M element data structure being a data structure having M number of elements, where each element in the N element data structure holds a value, and where N<M;

receiving as input at least a portion of metadata associated with the N element data structure, the metadata specifying for each value in the N element data structure one of the M elements of the original M element data structure in which the value originated;

identifying at least a portion of a destination M element data structure, the destination M element data structure being a destination data structure having M number of elements; and executing at least one instruction to decompress at least a portion of the N element data structure into the destination M element data structure by:

identifying one or more values of the N element data structure to be written to the destination M element data structure, determining, from the input metadata for each of the one or more values of the N element data structure, in which one of the M elements of the original M element data structure the value of the N element data structure originated, and writing each of the one or more values of the N element data structure to an element of the destination M element data structure that corresponds to the one of the M elements of the original M element data structure in which the value of the N element data structure originated.

13. A method for partially decompressing compressed data, comprising:

receiving as input at least a portion of an N element data structure, the N element data structure being a data structure having N number of elements, where the N element data structure was generated by compressing an original M element data structure, the original M element data structure being a data structure having M number of elements, where each element in the N element data structure holds a value, and where N<M;

receiving as input at least a portion of metadata associated with the N element data structure, the metadata specifying for each value in the N element data structure one of the M elements of the original M element data structure in which the value originated;

identifying at least two destination R element data structures, the at least two destination R element data structures each being a destination data structure having R number of elements, where N<=R<M, and where each of the at least two destination R element data structures represents a different portion of a destination M element data structure; and executing at least one instruction to decompress the N element data structure to the at least two destination R element data structures by:

identifying at least two portions of the input N element data structure to be stored in the at least two destination R element data structures, determining, from the input metadata for each of the at least two portions of the input N element data structure, in which one of the M elements of the original M element data structure the portion of the input N element data structure originated, and storing each of the at least two portions of the input N element data structure in one of the at least two destination R element data structures that represents the portion of the destination M element data structure which corresponds with the one of the elements of the original M element data structure in which the portion of the input N element data structure originated.

14. The method of claim 13, wherein the N element data structure is a N element vector and wherein the at least two destination R element data structures are each an R element vector, or the N element data structure is a N element tensor and wherein the at least two destination R element data structures are each an R element tensor.

15. The method of claim 13, wherein identifying the at least two destination R element data structures further includes initializing the at least two destination R element data structures by setting each element in the at least two destination R element data structures to zero.

16. The method of claim 13, wherein identifying the at least two destination R element data structures further includes initializing the at least two destination R element data structures by setting each element in the at least two destination R element data structure to values from another R element data structure.

17. The method of claim 13, wherein identifying the at least two destination R element data structures further includes initializing the at least two destination R element data structures by setting each element in the at least two destination R element data structures to values from a selection of R elements from a group of data structures.

18. The method of claim 13, wherein executing at least one instruction includes executing an instruction from a single thread or in a single execution lane.

19. The method of claim 18, wherein the single thread or execution lane uses a single instance of the at least two destination R element data structures.

20. The method of claim 13, wherein executing at least one instruction includes executing an instruction from multiple threads or in multiple execution lanes.

21. The method of claim 20, wherein the multiple threads or execution lanes are split into groups and each group uses a different instance of the at least two destination R element data structures.

22. The method of claim 13, executing at least one instruction to decompress the N element data structure to the at least two destination R element data structures further includes:

generating new metadata for each of the at least two destination R element data structures.

\* \* \* \* \*